United States Patent
Kanamura

(10) Patent No.: US 8,846,479 B2
(45) Date of Patent: Sep. 30, 2014

(54) SEMICONDUCTOR DEVICE AND METHOD FOR MANUFACTURING SEMICONDUCTOR DEVICE

(71) Applicant: Fujitsu Limited, Kawasaki (JP)

(72) Inventor: Masahito Kanamura, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/783,551

(22) Filed: Mar. 4, 2013

(65) Prior Publication Data

US 2013/0256686 A1  Oct. 3, 2013

(30) Foreign Application Priority Data

Mar. 29, 2012 (JP) .................. 2012-078260

(51) Int. Cl.
| | |
|---|---|
| H01L 21/336 | (2006.01) |
| H01L 21/36 | (2006.01) |
| H01L 21/02 | (2006.01) |
| H01L 29/66 | (2006.01) |
| H01L 29/207 | (2006.01) |
| H01L 29/36 | (2006.01) |
| H01L 29/778 | (2006.01) |
| H01L 29/205 | (2006.01) |
| H01L 29/20 | (2006.01) |

(52) U.S. Cl.
CPC ........... *H01L 29/205* (2013.01); *H01L 29/2003* (2013.01); *H01L 21/36* (2013.01); *H01L 21/02321* (2013.01); *H01L 29/66462* (2013.01); *H01L 29/207* (2013.01); *H01L 29/36* (2013.01); *H01L 29/778* (2013.01); *H01L 21/022* (2013.01); *H01L 29/7787* (2013.01)
USPC ...... 438/287; 438/591; 257/411; 257/E21.207

(58) Field of Classification Search
CPC ............ H01L 21/02112; H01L 21/022; H01L 21/02321; H01L 29/205; H01L 29/2003; H01L 29/778; H01L 29/7787
USPC .......... 438/287, 197, 591; 257/411, E21.403, 257/E21.407
See application file for complete search history.

(56) References Cited

U.S. PATENT DOCUMENTS

2007/0026587 A1  2/2007  Briere
2007/0218663 A1*  9/2007  Hao et al. ............... 438/532

(Continued)

FOREIGN PATENT DOCUMENTS

| JP | 2002-359256 A1 | 12/2002 |
| JP | 2010-199481 A1 | 9/2010 |

(Continued)

OTHER PUBLICATIONS

Notice of Preliminary Rejection mailed May 29, 2014 from the Korean Intellectual Property Office in counterpart application No. 10-2013-32968 with English translation.

*Primary Examiner* — William F Kraig
*Assistant Examiner* — Joseph C Nicely
(74) *Attorney, Agent, or Firm* — Kratz, Quintos & Hanson, LLP

(57) ABSTRACT

A semiconductor device includes: a first semiconductor layer formed over a substrate; a second semiconductor layer formed over the first semiconductor layer; an insulating film including a first insulating film formed over the second semiconductor layer, a second insulating film, and a third insulating film stacked sequentially over the first insulating film, and an electrode formed over the insulating film, wherein, in the first insulating film, a region containing halogen ions is formed under a region provided with the electrode, and the third insulating film contains a halogen.

20 Claims, 22 Drawing Sheets

(56) References Cited

U.S. PATENT DOCUMENTS

| | | |
|---|---|---|
| 2010/0301340 A1* | 12/2010 | Shih et al. .................. 257/59 |
| 2011/0081775 A1* | 4/2011 | Pierreux et al. ............. 438/591 |
| 2011/0121313 A1* | 5/2011 | Briere ........................ 257/76 |
| 2011/0140116 A1* | 6/2011 | Morosawa et al. ........... 257/59 |
| 2013/0105808 A1* | 5/2013 | Wong et al. .................. 257/76 |
| 2013/0224942 A1* | 8/2013 | Stahrenberg et al. ........ 438/588 |
| 2013/0292694 A1* | 11/2013 | Briere ........................ 257/76 |

FOREIGN PATENT DOCUMENTS

| | | |
|---|---|---|
| JP | 2011-14789 A1 | 1/2011 |
| KR | 10-1127904 B1 | 3/2012 |

* cited by examiner

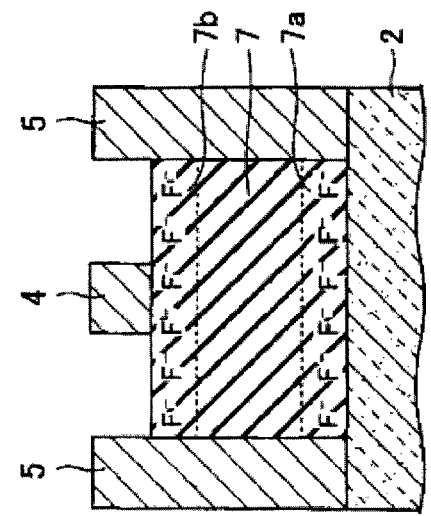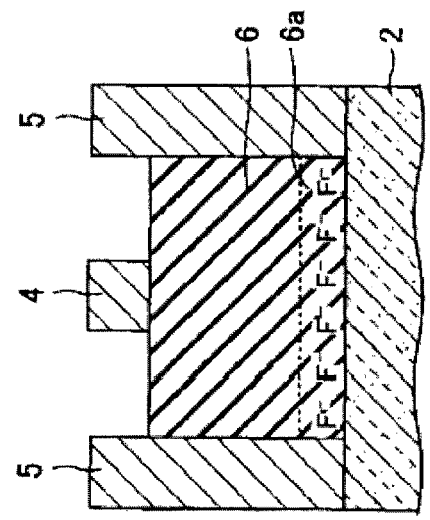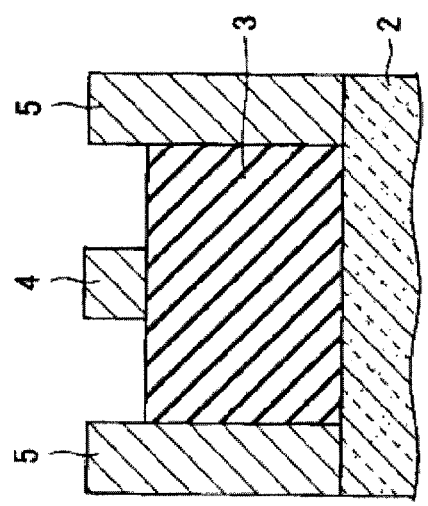

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2012-78260, filed on Mar. 29, 2012, the entire contents of which are incorporated herein by reference.

FIELD

The embodiments discussed herein are related to a semiconductor device and a method for manufacturing a semiconductor device.

BACKGROUND

Nitride semiconductors, for example, GaN, AlN, InN, and materials made from a mixed crystal thereof, have wide band gaps and have been used as high-output electronic devices, short-wavelength light-emitting devices, or the like. For example, GaN which is a nitride semiconductor has a band gap of 3.4 eV that is larger than the band gap of 1.1 eV of Si and the band gap of 1.4 eV of GaAs.

Examples of such high-output electronic devices include a field effect transistor (FET), in particular, a high electron mobility transistor (HEMT). Such a HEMT including a nitride semiconductor is used for high-output and high-efficiency amplifiers, high-power switching devices, or the like. Specifically, in a HEMT in which AlGaN is used for an electron supply layer and GaN is used for an electron transfer layer, piezoelectric polarization or the like occurs in AlGaN because of strain due to a lattice constant difference between AlGaN and GaN, and a high-concentration two-dimensional electron gas (2DEG) is generated. Consequently, such HEMT may operate at high voltages and be used for a high-voltage power device in a high-efficiency switching element, an electric car, or the like.

The 2DEG thus generated is usually present in a region under a gate even in a state in which a voltage is not applied to a gate electrode and the like. Therefore, a produced device becomes normally on. However, in general, it is desirable that a switching element for electric power and the like are normally off, that is, a current does not flow between a drain and a source in the case where a gate voltage is 0 V. Therefore, various structures and methods have been studied to ensure that the device becomes normally off. Meanwhile, a device having an insulating gate structure has been disclosed in which an insulating film is formed below a gate electrode to suppress a leakage current in a transistor such as a HEMT.

In order that a HEMT including a nitride semiconductor becomes normally off, the HEMT may have a structure in which a p-GaN cap layer is formed on an electron supply layer or a structure in which a gate recess is formed on an electron supply layer. However, crystal growth of the p-GaN cap layer is a difficult process and formation of the gate recess may be insufficient to become normally off. There is a method in which negative ions are implanted into a certain region of a semiconductor layer or a gate insulating film. However, nitride semiconductor layers such as an electron supply layer and an electron transfer layer may suffer significant damage by implantation of negative ions, which may cause, for example, the characteristics of a produced HEMT to be degraded, the uniformity of HEMTs to be degraded, and a yield may be degraded.

The following are reference documents:
[Document 1] Japanese Laid-open Patent Publication No. 2002-359256,
[Document 2] Japanese Laid-open Patent Publication No. 2011-14789 and
[Document 3] Japanese Laid-open Patent Publication No. 2010-199481.

SUMMARY

According to an aspect of the invention, a semiconductor device includes: a first semiconductor layer formed over a substrate; a second semiconductor layer formed over the first semiconductor layer; an insulating film including a first insulating film formed over the second semiconductor layer, a second insulating film, and a third insulating film stacked sequentially over the first insulating film, and an electrode formed over the insulating film, wherein, in the first insulating film, a region containing halogen ions is formed under a region provided with the electrode, and the third insulating film contains a halogen.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A to 1C are explanatory diagrams of samples in which an $Al_2O_3$ film is formed on GaN;

DESCRIPTION OF EMBODIMENTS

Figure 2:
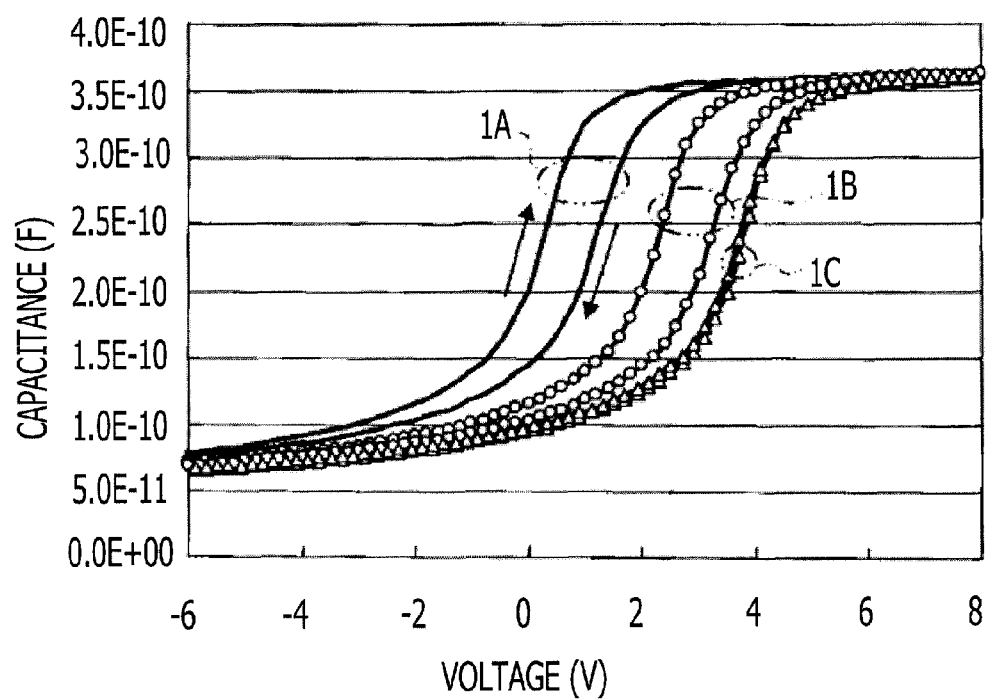
FIG. 2 is a correlation diagram between the voltage and the capacitance of samples in which an $Al_2O_3$ film is formed on GaN.

The embodiments are described below. In this regard, the same members and the like are indicated by the same reference numerals and further explanations thereof may be omitted.

First Embodiment

As described above, in the case where negative ions of fluorine ions or the like are, for example, implanted into a nitride semiconductor layer by ion implantation or plasma irradiation, the nitride semiconductor layer suffers damage, and the characteristics may be degraded or the yield maybe degraded. Meanwhile, in order to suppress a leakage current, some transistors, for example, HEMTs, have a structure in which an insulating film is formed between a nitride semiconductor layer and a gate electrode, that is, the insulating film is formed on the nitride semiconductor layer and the gate electrode is formed on the insulating film. The inventor has studied and found that a device may become normally off without degrading the characteristics and the like of the HEMT or the like by implanting negative ions into only the gate film while negative ions are not implanted into the nitride semiconductor layer. That is, it was found that in the case where negative ions were, for example, implanted into only the gate insulating film, the nitride semiconductor layer did not suffer damage and, therefore, the device may become normally off without degrading the characteristics and the like of the HEMT or the like.

The experiments which were performed based on the above-described contents are described with reference to FIGS. 1A to 1C and FIG. 2. Specifically, three types of samples depicted in FIGS. 1A to 1C were produced and C-V characteristics were examined. A sample 1A depicted in FIG. 1A has a structure in which an n-GaN film 2 is formed on a substrate (not depicted), an insulating film 3 is formed on the n-GaN film 2, a first electrode 4 is formed on the insulating film 3, and a second electrode 5 is formed in contact with the n-GaN film 2. The n-GaN film 2 is doped with $1 \times 10^{17}/cm^3$ of Si serving as an impurity element and the insulating film 3 is formed from $Al_2O_3$.

A sample 1B depicted in FIG. 1B has a structure in which an n-GaN film 2 is formed on a substrate (not depicted), an insulating film 6 is formed on the n-GaN film 2, a first electrode 4 is formed on the insulating film 6, and a second electrode 5 is formed in contact with the n-GaN film 2. The n-GaN film 2 is doped with $1 \times 10^{17}/cm^3$ of Si serving as an impurity element and the insulating film 6 is formed from $Al_2O_3$. In addition, in the insulating film 6, a region 6a containing fluorine ions by ion implantation is formed in the vicinity of the interface between the insulating film 6 and the n-GaN film 2.

A sample 1C depicted in FIG. 1C has a structure in which an n-GaN film 2 is formed on a substrate (not depicted), an insulating film 7 is formed on the n-GaN film 2, a first electrode 4 is formed on the insulating film 7, and a second electrode 5 is formed in contact with the n-GaN film 2. The n-GaN film 2 is doped with $1 \times 10^{17}/cm^3$ of Si serving as an impurity element and the insulating film 7 is formed from $Al_2O_3$. In addition, in the insulating film 7, a region 7a containing fluorine ions by ion implantation is formed in the vicinity of the interface between the insulating film 7 and the n-GaN film 2, and a region 7b containing fluorine ions by ion implantation is formed in the vicinity of the surface of the insulating film 7 on the side in which the first electrode 4 is formed.

FIG. 2 depicts changes in the capacitance between the first electrode 4 and the second electrode 5 (C-V characteristic) in the case where each of the samples depicted in FIGS. 1A to 1C is produced and the voltage applied between the first electrode 4 and the second electrode 5 is changed. Specifically, changes in the capacitance are depicted, where the applied voltage is changed from −10 V to +10 V and, thereafter, the applied voltage is changed from +10 V to −10 V. The characteristics and the like of the samples 1A to 1C are explained with reference to FIG. 2.

In the case where the voltage of the sample 1A having the structure depicted in FIG. 1A increases, the capacitance begins to change before the voltage reaches 0 V. In addition, in the case where the voltage increases and decreases, the values of capacitances at the same voltage are different from each other, so that a hysteresis is exhibited. Therefore, it is believed that a HEMT formed based on the structure of the sample 1A is not normally off, and a fluctuation range of the gate threshold voltage is large and the uniformity is low because the hysteresis is exhibited.

In the case where the voltage of the sample 1B having the structure depicted in FIG. 1B increases, the capacitance does not change much before the voltage reaches 0 V. In addition, in the case where the voltage increases and decreases, the values of capacitances at the same voltage are different from each other, so that a hysteresis is exhibited. Therefore, it is believed that a HEMT formed based on the structure of the sample 1B becomes normally off, although a fluctuation range of the gate threshold voltage is large and the uniformity is low because the hysteresis is exhibited.

In the case of the sample 1C having the structure depicted in FIG. 1C, the capacitance almost remain unchanged before the voltage reaches 0 V. In addition, in the case where the voltage increases and decreases, the values of capacitances at the same voltage are nearly equal to each other, so that a hysteresis is scarcely exhibited. Therefore, it is believed that a HEMT formed based on the structure of the sample 1C becomes normally off, and a fluctuation range of the gate threshold voltage is small and the uniformity is high because the hysteresis is scarcely exhibited. In this regard, the gate threshold voltage of the sample 1C may be shifted to a positive side more reliably and a semiconductor device which is normally off and which has a high threshold voltage may be obtained because the capacitance change and the like start at a high voltage as compared with the case of the sample 1B.

As described above, a stable HEMT which is normally off and which exhibits a small fluctuation range of the gate threshold voltage may be obtained by producing a semiconductor device having a structure based on the structure of the sample 1C. That is, a stable HEMT which is normally off and which exhibits a small fluctuation range of the gate threshold voltage may be obtained by forming a region containing fluorine ions in the gate insulating film in the vicinity of the interface between the gate insulating film and the n-GaN film or the like and forming a region containing fluorine ions in the vicinity of the surface of the gate insulating film.

Semiconductor Device

Figure 3:
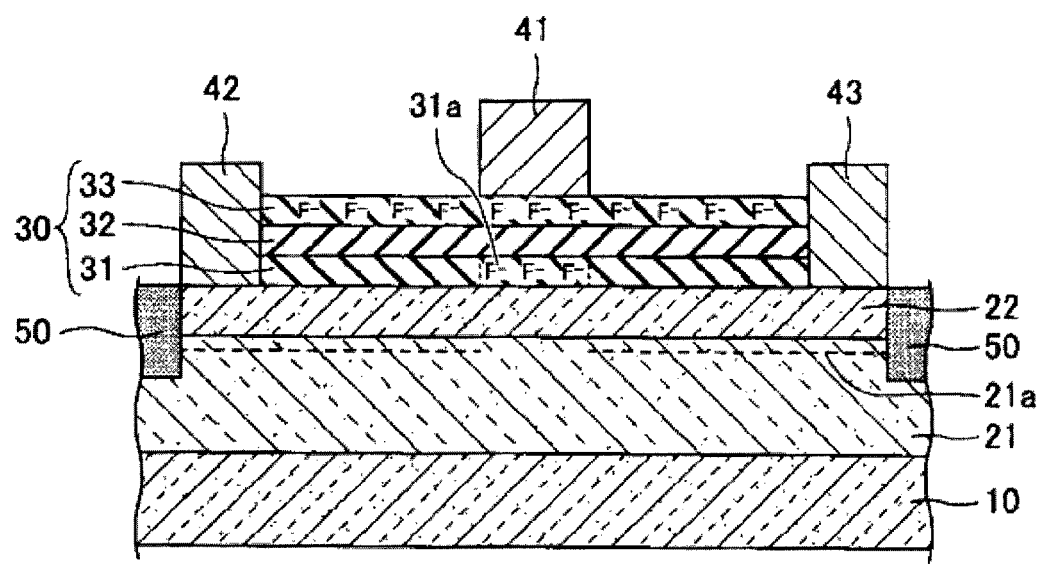
FIG. 3 is a structural diagram of a semiconductor device according to a first embodiment.

A semiconductor device according to a first embodiment is described with reference to FIG. 3. The semiconductor device according to the first embodiment is formed by stacking a buffer layer (not depicted), an electron transfer layer 21, and an electron supply layer 22, which are nitride semiconductor layers, sequentially on a substrate 10. Consequently, a 2DEG 21a is formed in the electron transfer layer 21 in the vicinity of the interface between the electron transfer layer 21 and the electron supply layer 22. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm.

An insulating film 30 serving as a gate insulating film formed from a first insulating film 31, a second insulating film 32, and a third insulating film 33 is formed on the electron supply layer 22. The first insulating film 31 is formed from aluminum oxide (Al2O3), and a region 31a containing fluorine ions (F—) is formed in a region under a gate electrode 41 described later. The second insulating film 32 is formed from Al2O3, and the third insulating film 33 is formed from Al2O3 containing fluorine ions. The gate electrode 41 is formed in a predetermined region on the surface of the third insulating film 33, and a source electrode 42 and a drain electrode 43 are formed in contact with the electron supply layer 22. In this regard, a structure in which a gate recess is formed by removing part of the electron supply layer 22 and the like in a region under the gate electrode 41 may be employed.

As described above, the semiconductor device according to the first embodiment may be normally off because the 2DEG 21a in the region under the gate electrode 41 may disappear by forming the region 31a containing fluorine ions in the first insulating film 31 in the region under the gate electrode 41. Meanwhile, in the case where the region 31a containing fluorine ions is formed beyond the region under the gate electrode 41, the region in which the 2DEG 21a disappears extends to a region out of the region under the gate electrode 41 and, thereby, the function as a transistor may not be performed. In the first embodiment, the region 31a containing fluorine ions may be referred to as a region containing halogen ions. In addition, a region containing fluorine ions may be formed almost throughout the third insulating film 33. Element isolation regions 50, which isolate elements from each other, are formed in the electron transfer layer 21 and the electron supply layer 22.

The semiconductor device according to the first embodiment may become normally off and may exhibit a small fluctuation range of the gate threshold voltage. Because the insulating film 30 in the vicinity of the interface between the electron supply layer 22 and the insulating film 30, and the insulating film 30 in the vicinity of the surface thereof are doped with fluorine ions. In the first embodiment, the case where the insulating film 30 is doped with fluorine ions have been explained. However, it is believed that the same effects may also be obtained in the case where ions of halogens, for example, chlorine, bromine, iodine, or astatine, other than fluorine ions are employed.

Manufacturing Method

Next, a method for manufacturing a semiconductor device according to the first embodiment is described with reference to FIG. 4A to FIG. 6B.

Figure 4A:
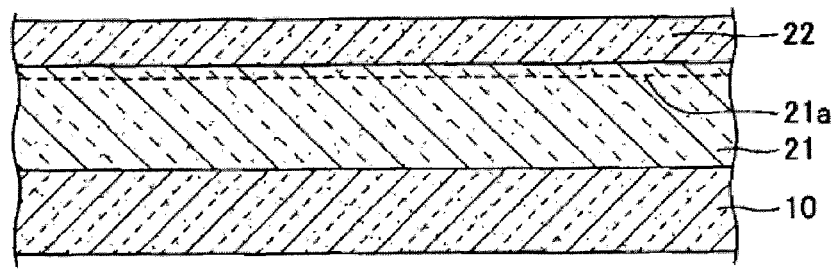
FIGS. 4A to 4C are step diagrams of a method for manufacturing the semiconductor device according to the first embodiment.

As depicted in FIG. 4A, a buffer layer (not depicted), an electron transfer layer 21, and an electron supply layer 22, which are nitride semiconductor layers, are formed on a substrate 10 through epitaxial growth by metal organic vapor phase epitaxy (MOVPE). As for the substrate 10, a substrate of Si, sapphire, SiC, GaN, AlN, or the like may be used. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm. Consequently, a 2DEG 21a is formed in the electron transfer layer 21 in the vicinity of the interface between the electron transfer layer 21 and the electron supply layer 22. In this regard, a cap layer and the like (not depicted) may be formed on the electron supply layer 22, and an intermediate layer and the like may be formed between the electron transfer layer 21 and the electron supply layer 22.

In MOVPE according to the first embodiment, trimethyl gallium (TMG) is used as a raw material gas for Ga, trimethyl aluminum (TMA) is used as a raw material gas for Al, and ammonia (NH3) is used as a raw material gas for N. In the case where parts of the nitride semiconductor layers are formed into the n-type, Si is used as an impurity element, and monosilane (SiH3) or the like is used as a raw material gas for Si. These raw material gases are supplied to a reaction furnace (chamber) of an MOVPE apparatus while hydrogen (H2) is employed as a carrier gas.

Figure 4B:
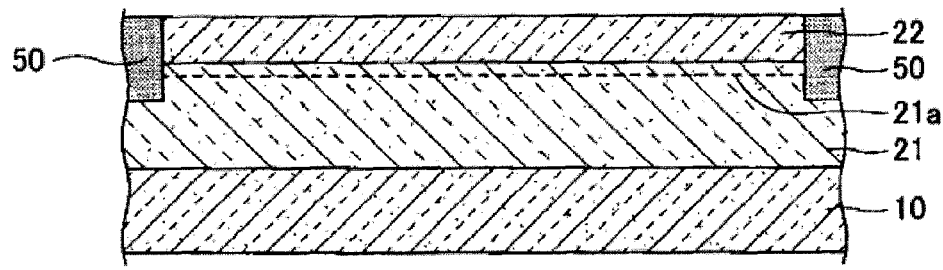

As depicted in FIG. 4B, element isolation regions 50 are formed in the resulting semiconductor layer. Specifically, a photoresist is applied to the electron supply layer 22, and exposure and development are performed by an exposing apparatus so as to form a resist pattern (not depicted) which has openings in regions to be provided with the element isolation regions 50. Thereafter, the element isolation regions 50 are formed by dry etching with a chlorine base gas and embedding of an insulating material, or ion implantation. After the element isolation regions 50 are formed, the resist pattern is removed with an organic solvent or the like.

Figure 4C:
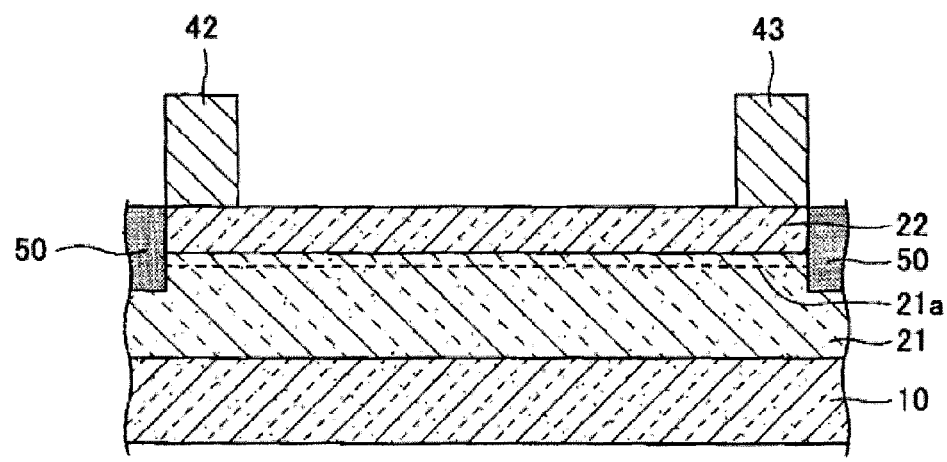

As depicted in FIG. 4C, a source electrode 42 and a drain electrode 43 are formed on the electron supply layer 22. Specifically, a photoresist is applied to the electron supply layer 22, and exposure and development are performed by an exposing apparatus so as to form a resist pattern (not depicted) which has openings in regions to be provided with the source electrode 42 and the drain electrode 43. Thereafter, a Ti/Al laminated metal film is formed by vacuum evaporation and is immersed in an organic solvent or the like so as to remove the laminated metal film formed on the resist pattern together with the resist pattern by lift-off. Consequently, the source electrode 42 and the drain electrode 43 are formed from the Ti/Al laminated metal film remaining on the electron supply layer 22. Subsequently, a heat treatment is performed at a temperature of about 700° C. and, thereby, the source electrode 42 and the drain electrode 43 are brought into ohmic contact.

Figure 5A:
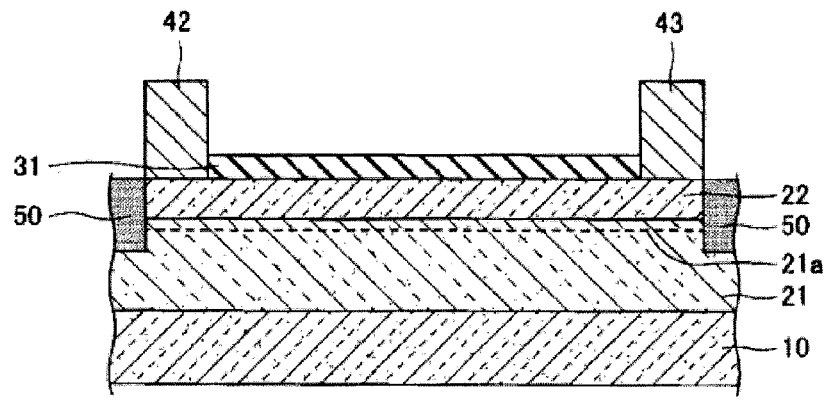
FIGS. 5A to 5C are step diagrams of the method for manufacturing the semiconductor device according to the first embodiment.

As depicted in FIG. 5A, a first insulating film 31 is formed. Specifically, a film of Al2O3 having a thickness of 10 nm is formed on the electron supply layer 22 by atomic layer deposition (ALD). In addition to ALD, the methods for manufacturing the first insulating film 31 may include film formation methods, for example, plasma chemical vapor deposition (CVD), thermal CVD, metal organic chemical vapor deposition (MOCVD), sputtering, and electron beam evaporation. Examples of materials for forming the first insulating film 31 include oxides, nitrides, and oxynitrides. The first insulating film 31 may be formed from $SiO_2$, $HfO_2$, $Ta_2O_5$, $ZrO_2$, MgO, SiN, AlN, SiON, or AlON instead of $Al_2O_3$. The film thickness of the first insulating film 31 is not limited to the above-described film thickness. After the first insulating film 31 is formed, a heat treatment or the like may be performed. In this regard, a structure may be employed in which part of the electron supply layer 22 and the like under the region to be provided with the gate electrode 41, described later, is removed by dry etching or the like before the first insulating film 31 is formed and, thereafter, the first insulating film 31 is formed.

Figure 5B:
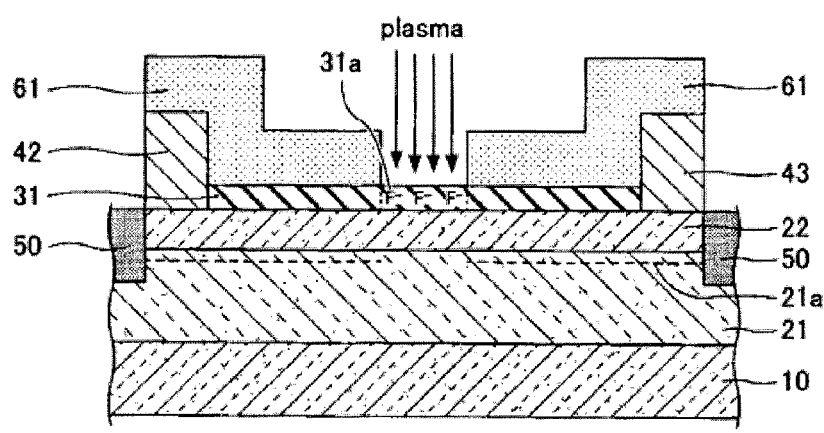

As depicted in FIG. 5B, a region 31a containing fluorine ions is formed in a region in the first insulating film 31 under the region to be provided with the gate electrode 41, described later, by implanting fluorine ions. Specifically, a photoresist is applied to the surface of the first insulating film 31, and exposure and development are performed by an exposing apparatus so as to form a resist pattern 61 which has an opening to become a region under the gate electrode 41, described later. Then, plasma irradiation is performed using $CF_4$. As for the condition of the plasma irradiation performed at this time, the flow rate of $CF_4$ is 15 sccm, the pressure in a chamber is 3 Pa, the applied voltage is 50 W, and the irradiation time is 5 minutes. In this manner, fluorine ions (F—) are allowed to be implanted into only a region not provided with the resist pattern 61 so as to form the region 31a containing fluorine ions. The concentration of fluorine ions implanted at this time is $1 \times 10^{15}$ to $1 \times 10^{19}$ cm-3, and examples of gases used for plasma irradiation include $SF_6$, $NF_3$, and $F_2$ in addition to $CF_4$. The region 31a containing fluorine ions may be formed by ion implantation of fluorine ions instead of plasma irradiation. In this regard, if the fluorine ions are implanted up to the nitride semiconductor layer, for example, the electron supply layer 22 that is deeper than the first insulating film 31, the nitride semiconductor layer may be damaged and the characteristics and the like may be adversely affected. Therefore, it is preferable that fluorine ions be scarcely implanted into the nitride semiconductor layer and be implanted into only the region 31a containing fluorine ions in the first insulating film 31. Meanwhile, in the first embodiment, plasma irradiation using $CF_4$ may be referred to as plasma irradiation using a halogen compound, and ion implantation of fluorine ions may be referred to as ion implantation of halogen ions.

Figure 5C:
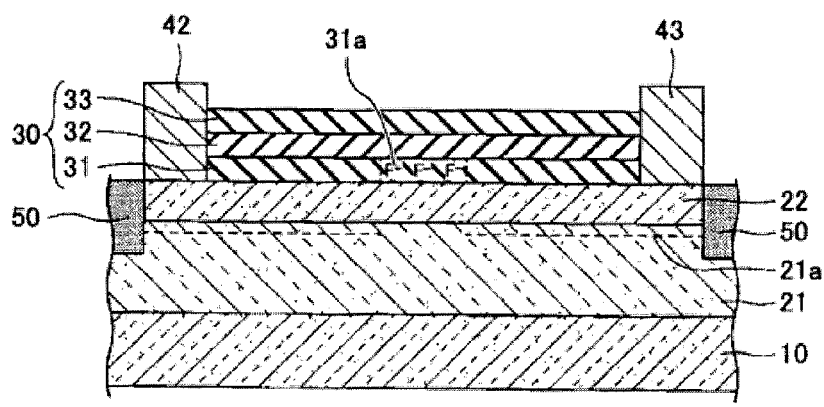

As depicted in FIG. 5C, the resist pattern 61 is removed with an organic solvent or the like and, thereafter, a second insulating film 32 and a third insulating film 33 are formed on the first insulating film 31. Specifically, a film of $Al_2O_3$ having a thickness of 15 nm is formed on the first insulating film 31 by ALD, so as to form the second insulating film 32. In addition, the third insulating film 33 is formed on the second insulating film 32 by forming a film of $Al_2O_3$ having a thickness of 15 nm. The methods for manufacturing the second insulating film 32 and the third insulating film 33 include film formation methods, for example, plasma CVD, thermal CVD, MOCVD, sputtering, and electron beam evaporation, other than ALD. Examples of materials for forming the second insulating film 32 and the third insulating film 33 include oxides, nitrides, and oxynitrides, and may be $SiO_2$, $HfO_2$, $Ta_2O_5$, $ZrO_2$, MgO, SiN, AlN, SiON, or AlON instead of $Al_2O_3$. In this regard, the second insulating film 32 and the third insulating film 33 may be formed by continuous film formation.

Figure 6A:
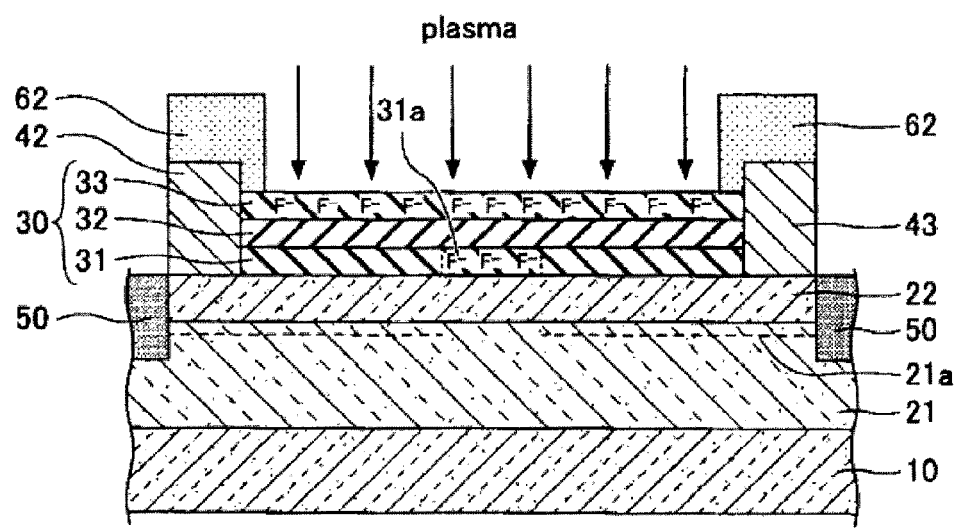
FIGS. 6A and 6B are step diagrams of the method for manufacturing the semiconductor device according to the first embodiment.

As depicted in FIG. 6A, fluorine ions are implanted into the third insulating film 33. Specifically, a photoresist is applied to the surface of the third insulating film 33, and exposure and development are performed by an exposing apparatus so as to form a resist pattern 62 on the regions provided with the source electrode 42 and the drain electrode 43. Then, plasma irradiation is performed using $CF_4$. As for the condition of the plasma irradiation performed at this time, the flow rate of $CF_4$ is 15 sccm, the pressure in a chamber is 3 Pa, the applied voltage is 50 W, and the irradiation time is 5 minutes. In this manner, fluorine ions are implanted into a region not provided with the resist pattern 62. The concentration of fluorine ions implanted at this time is $1 \times 10^{15}$ to $1 \times 10^{19}$ cm-3, and examples of gases used for plasma irradiation include $SF_6$, $NF_3$, and $F_2$ in addition to $CF_4$. Fluorine ions may be implanted into the third insulating film 33 by ion implantation of fluorine ions instead of plasma irradiation. In this regard, it is preferable that fluorine ions be implanted within the region of the third insulating film 33. In addition, it is preferable that the third insulating film 33 implanted with fluorine ions and the region 31a containing fluorine ions in the first insulating film 31 be separated by the second insulating film 32.

Figure 6B:
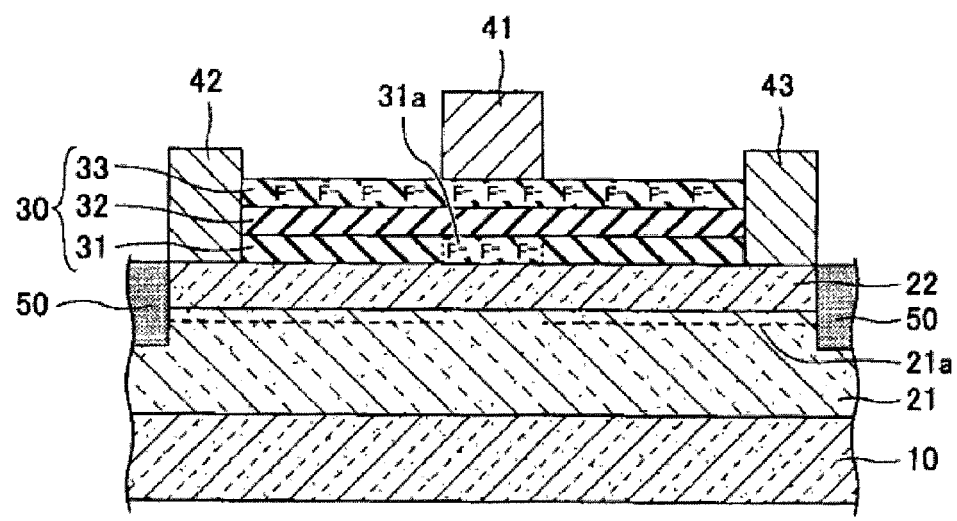

As depicted in FIG. 6B, the resist pattern 62 is removed with an organic solvent or the like and, thereafter, the gate electrode 41 is formed in a predetermined region on the third insulating film 33. Specifically, a photoresist is applied to the third insulating film 33, and exposure and development are performed by an exposing apparatus so as to form a resist pattern (not depicted) which has an opening in a region to be provided with the gate electrode 41. This resist pattern is formed in such a way that the opening is formed at the position above the region 31a containing fluorine ions in the first insulating film 31. Thereafter, a Ni/Au laminated metal film is formed by vacuum evaporation and is immersed in an organic solvent or the like so as to remove the laminated metal film formed on the resist pattern together with the resist pattern by lift-off. Consequently, the gate electrode 41 is formed from the Ni/Au laminated metal film remaining on the third insulating film 33 above the region 31a containing fluorine ions.

In this manner, the semiconductor device according to the first embodiment is allowed to be produced. In the semiconductor device according to the first embodiment, fluorine ions are scarcely implanted or not implanted into the nitride semiconductor layers such as the electron supply layer and the electron transfer layer, so that the nitride semiconductor layers are scarcely damaged. Therefore, in the first embodiment, a semiconductor device which is normally off and which exhibits a stable gate threshold voltage may be obtained.

Second Embodiment

Semiconductor Device

Figure 7:
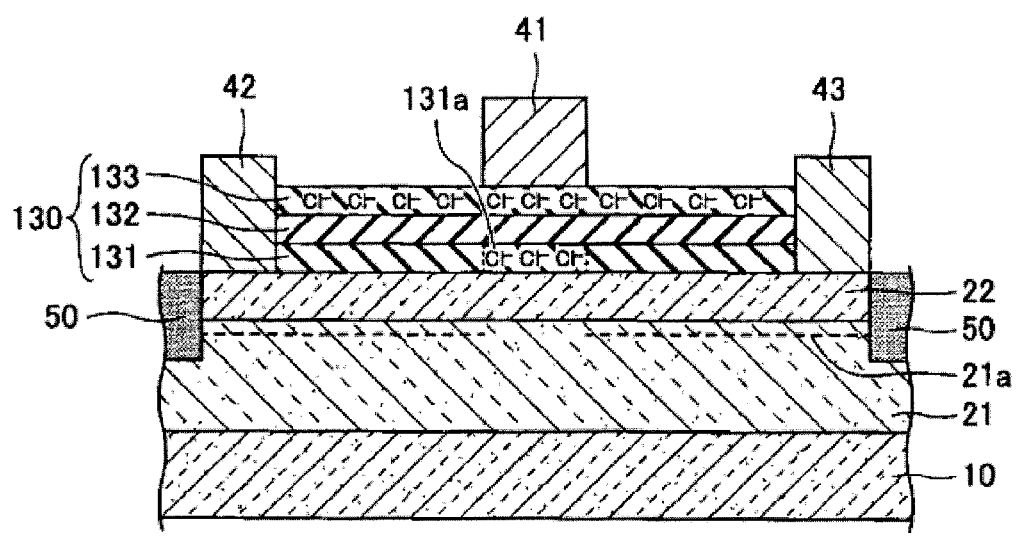
FIG. 7 is a structural diagram of a semiconductor device according to a second embodiment.

Next, a semiconductor device according to a second embodiment is described with reference to FIG. 7. The semiconductor device according to the second embodiment has a structure in which halogen ions implanted into the insulating film in the semiconductor device according to the first embodiment is changed from fluorine ions to chlorine ions.

The semiconductor device according to the second embodiment is formed by stacking a buffer layer (not depicted), an electron transfer layer 21, and an electron supply layer 22, which are nitride semiconductor layers, sequentially on a substrate 10 of silicon or the like. Consequently, a 2DEG 21a is formed in the electron transfer layer 21 in the vicinity of the interface between the electron transfer layer 21 and the electron supply layer 22. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm.

An insulating film 130 serving as a gate insulating film formed from a first insulating film 131, a second insulating film 132, and a third insulating film 133 is formed on the electron supply layer 22. The first insulating film 131 is formed from Al2O3, and a region 131a containing chlorine ions (Cl—) is formed in a region under a gate electrode 41 described later. The second insulating film 132 is formed from Al2O3, and the third insulating film 133 is formed from Al2O3 containing chlorine ions. The gate electrode 41 is formed in a predetermined region on the surface of the third insulating film 133, and a source electrode 42 and a drain electrode 43 are formed in contact with the electron supply layer 22. In this regard, a structure in which a gate recess is formed by removing part of the electron supply layer 22 and the like in a region under the gate electrode 41 may be employed.

As described above, the semiconductor device according to the second embodiment may be normally off because the 2DEG 21a in the region under the gate electrode 41 may disappear by forming the region 131a containing chlorine ions in the first insulating film 131 in the region under the gate electrode 41. Meanwhile, in the case where the region 131a containing chlorine ions is formed beyond the region under the gate electrode 41, the region in which the 2DEG 21a disappears extends to a region out of the region under the gate electrode 41 and, thereby, the function as a transistor may not be performed. In the second embodiment, the region 131a containing chlorine ions may be referred to as a region containing halogen ions. In addition, a region containing chlorine ions is specified to be formed almost throughout the third insulating film 133. Element isolation regions 50, which isolate elements from each other, are formed in the electron transfer layer 21 and the electron supply layer 22.

The semiconductor device according to the second embodiment may become normally off and may further exhibit a small fluctuation range of the gate threshold voltage. Because the insulating film 130 in the vicinity of the interface between the insulating film 130 and the electron supply layer 22 and the insulating film 130 in the vicinity of the surface thereof are doped with chlorine ions.

Manufacturing Method

Next, a method for manufacturing a semiconductor device according to the second embodiment is described with reference to FIG. 8A to FIG. 10B.

Figure 8A:
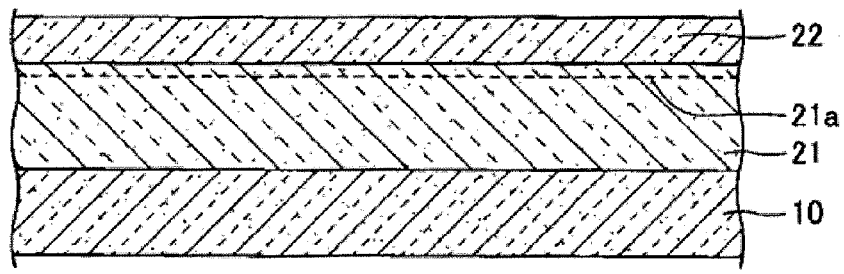
FIGS. 8A to 8C are step diagrams of a method for manufacturing the semiconductor device according to the second embodiment.

As depicted in FIG. 8A, a buffer layer (not depicted), an electron transfer layer 21, and an electron supply layer 22, which are nitride semiconductor layers, are formed on a substrate 10 through epitaxial growth by MOVPE. As for the substrate 10, a substrate of Si, sapphire, SiC, GaN, AlN, or the like may be used. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm. Consequently, a 2DEG 21a is formed in the electron transfer layer 21 in the vicinity of the interface between the electron transfer layer 21 and the electron supply layer 22. In this regard, a cap layer and the like (not depicted) may be formed on the electron supply layer 22, and an intermediate layer and the like may be formed between the electron transfer layer 21 and the electron supply layer 22.

In MOVPE according to the second embodiment, trimethyl gallium (TMG) is used as a raw material gas for Ga, trimethyl aluminum (TMA) is used as a raw material gas for Al, and ammonia (NH3) is used as a raw material gas for N. In the case where parts of the nitride semiconductor layers are formed into the n-type, Si is used as an impurity element, and monosilane (SiH3) or the like is used as a raw material gas for Si. These raw material gases are supplied to a reaction furnace (chamber) of an MOVPE apparatus while hydrogen (H2) is employed as a carrier gas.

Figure 8B:
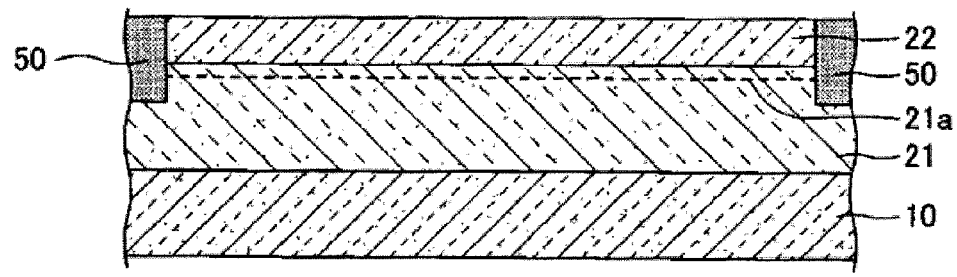

As depicted in FIG. 8B, element isolation regions 50 are formed in the resulting semiconductor layer. Specifically, a photoresist is applied to the electron supply layer 22, and exposure and development are performed by an exposing apparatus so as to form a resist pattern (not depicted) which has openings in regions to be provided with the element isolation regions 50. Thereafter, the element isolation regions 50 are formed by dry etching with a chlorine base gas and embedding of an insulating material, or ion implantation. After the element isolation regions 50 are formed, the resist pattern is removed with an organic solvent or the like.

Figure 8C:
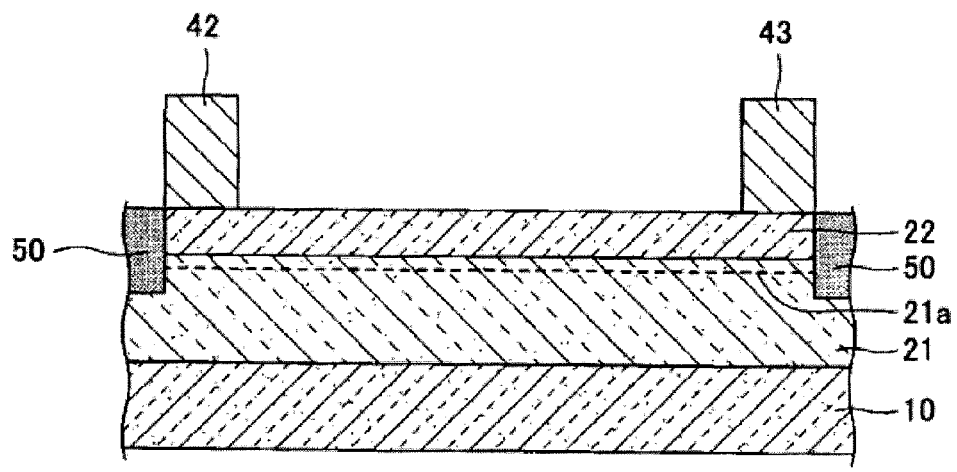

As depicted in FIG. 8C, a source electrode 42 and a drain electrode 43 are formed on the electron supply layer 22. Specifically, a photoresist is applied to the electron supply layer 22, and exposure and development are performed by an exposing apparatus so as to form a resist pattern (not depicted) which has openings in regions to be provided with the source electrode 42 and the drain electrode 43. Thereafter, a Ti/Al laminated metal film is formed by vacuum evaporation and is immersed in an organic solvent or the like so as to remove the laminated metal film formed on the resist pattern together with the resist pattern by lift-off. Consequently, the source electrode 42 and the drain electrode 43 are formed from the Ti/Al laminated metal film remaining on the electron supply layer 22. Subsequently, a heat treatment is performed at a temperature of about 700° C. and, thereby, the source electrode 42 and the drain electrode 43 are brought into ohmic contact.

Figure 9A:
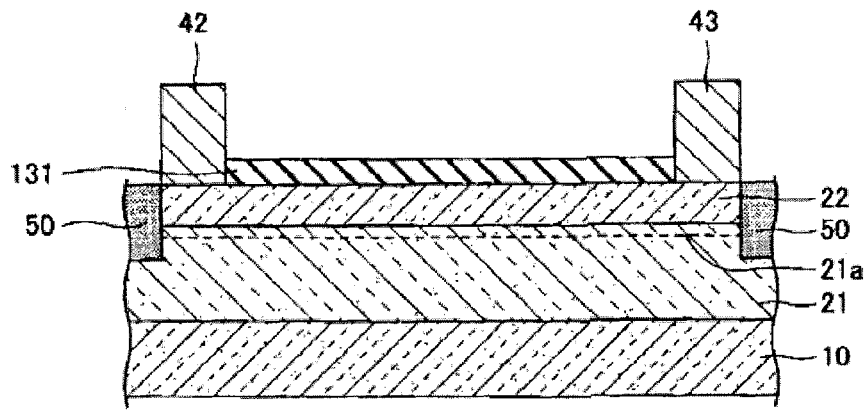
FIGS. 9A to 9C are step diagrams of the method for manufacturing the semiconductor device according to the second embodiment.

As depicted in FIG. 9A, a first insulating film 131 is formed. Specifically, a film of Al2O3 having a thickness of 10 nm is formed on the electron supply layer 22 by ALD. The methods for manufacturing the first insulating film 131 may include film formation methods, for example, plasma CVD, thermal CVD, MOCVD, sputtering, and electron beam evaporation other than ALD. Examples of materials for forming the first insulating film 131 include oxides, nitrides, and oxynitrides. The first insulating film 131 may be formed from SiO2, HfO2, Ta2O5, ZrO2, MgO, SiN, AlN, SiON, or AlON instead of Al2O3. The film thickness of the first insulating film 131 is not limited to the above-described film thickness. After the first insulating film 131 is formed, a heat treatment or the like may be performed. In this regard, a structure may be employed in which part of the electron supply layer 22 and the like under the region to be provided with a gate electrode 41, described later, is removed by dry etching or the like before the first insulating film 131 is formed and, thereafter, the first insulating film 131 is formed.

Figure 9B:
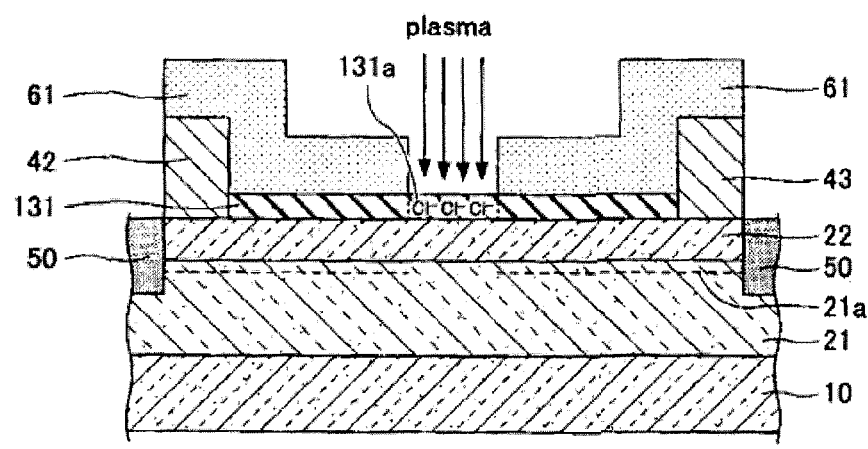

As depicted in FIG. 9B, a region 131a containing chlorine ions is formed in the first insulating film 131 in a region under the region to be provided with the gate electrode 41, described later, by implanting chlorine ions. Specifically, a photoresist is applied to the surface of the first insulating film 131, and exposure and development are performed by an exposing apparatus so as to form a resist pattern 61 which has an opening to become a region under the gate electrode 41. Then, plasma irradiation is performed using Cl2. As for the condition of the plasma irradiation performed at this time, the flow rate of Cl2 is 30 sccm, the pressure in a chamber is 2 Pa, the applied voltage is 40 W, and the irradiation time is 5 minutes. In this manner, chlorine ions (Cl—) are allowed to be implanted into only a region not provided with the resist pattern 61 so as to form the region 131a containing chlorine ions. The concentration of chlorine ions implanted at this time is $1\times10^{15}$ to $1\times10^{19}$ cm-3. Examples of gases used for plasma irradiation include CCl4, BCl3, and SiCl4 in addition to Cl2. The region 131a containing chlorine ions may be formed by ion implantation of chlorine ions instead of plasma irradiation. In this regard, if the chlorine ions are implanted up to the nitride semiconductor layer, for example, the electron supply layer 22 that is deeper than the first insulating film 131, the nitride semiconductor layer may be damaged and the characteristics and the like may be adversely affected. Therefore, it is preferable that chlorine ions be scarcely implanted into the nitride semiconductor layer and be implanted into only the region 131a containing chlorine ions in the first insulating film 131. Meanwhile, in the second embodiment, plasma irradiation using Cl2 may be referred to as plasma irradiation using a halogen compound, and ion implantation of chlorine ions may be referred to as ion implantation of halogen ions.

Figure 9C:
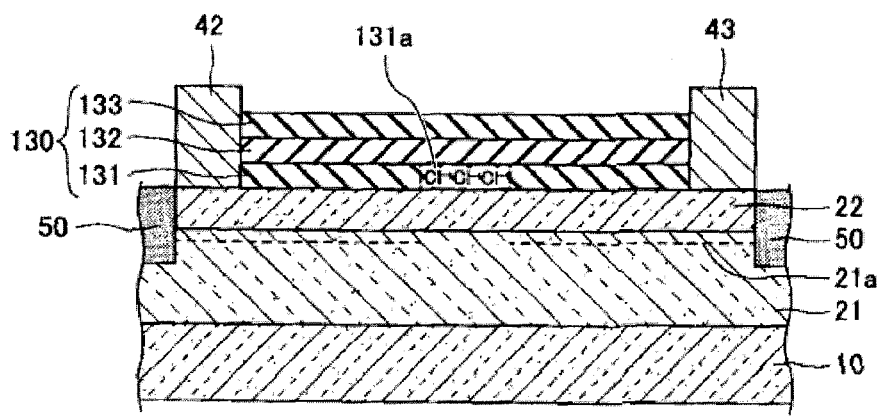

As depicted in FIG. 9C, the resist pattern 61 is removed with an organic solvent or the like and, thereafter, a second insulating film 132 and a third insulating film 133 are formed on the first insulating film 131. Specifically, a film of Al2O3 having a thickness of 15 nm is formed on the first insulating film 131 by ALD, so as to form the second insulating film 132. In addition, the third insulating film 133 is formed on the second insulating film 132 by forming a film of Al2O3 having a thickness of 15 nm. The methods for manufacturing the second insulating film 132 and the third insulating film 133 include film formation methods, for example, plasma CVD, thermal CVD, MOCVD, sputtering, and electron beam evaporation, other than ALD. Examples of materials for forming the second insulating film 132 and the third insulating film 133 include oxides, nitrides, and oxynitrides, and may be SiO2, HfO2, Ta2O5, ZrO2, MgO, SiN, AlN, SiON, or AlON instead of Al2O3. In this regard, the second insulating film 132 and the third insulating film 133 may be formed by continuous film formation.

Figure 10A:
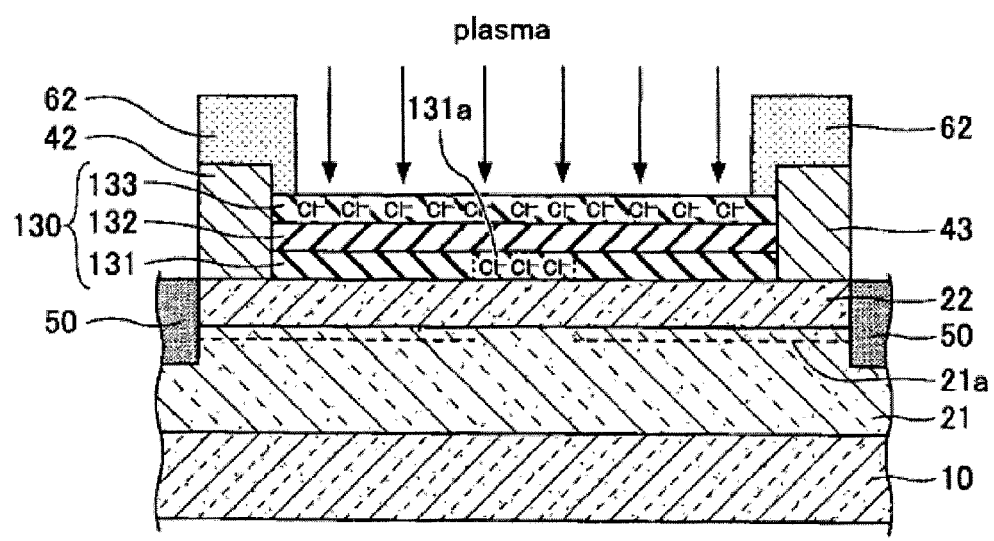
FIGS. 10A and 10B are step diagrams of the method for manufacturing the semiconductor device according to the second embodiment.

As depicted in FIG. 10A, chlorine ions are implanted into the third insulating film 133. Specifically, a photoresist is applied to the surface of the third insulating film 133, and exposure and development are performed by an exposing apparatus so as to form a resist pattern 62 on the regions provided with the source electrode 42 and the drain electrode 43. Then, plasma irradiation is performed using Cl2. As for the condition of the plasma irradiation performed at this time, the flow rate of Cl2 is 30 sccm, the pressure in a chamber is 2 Pa, the applied voltage is 40 W, and the irradiation time is 5 minutes. In this manner, chlorine ions are implanted into a region not provided with the resist pattern 62. The concentration of chlorine ions implanted at this time is $1\times10^{15}$ to $1\times10^{19}$ cm-3, and examples of gases used for plasma irradiation include CCl4, BCl3, and SiCl4 in addition to Cl2. Chlorine ions may be implanted into the third insulating film 133 by ion implantation of chlorine ions instead of plasma irradiation. In this regard, it is preferable that chlorine ions be implanted within the region of the third insulating film 133. In addition, it is preferable that the third insulating film 133 implanted with chlorine ions and the region 131a containing chlorine ions in the first insulating film 131 be separated by the second insulating film 132.

Figure 10B:
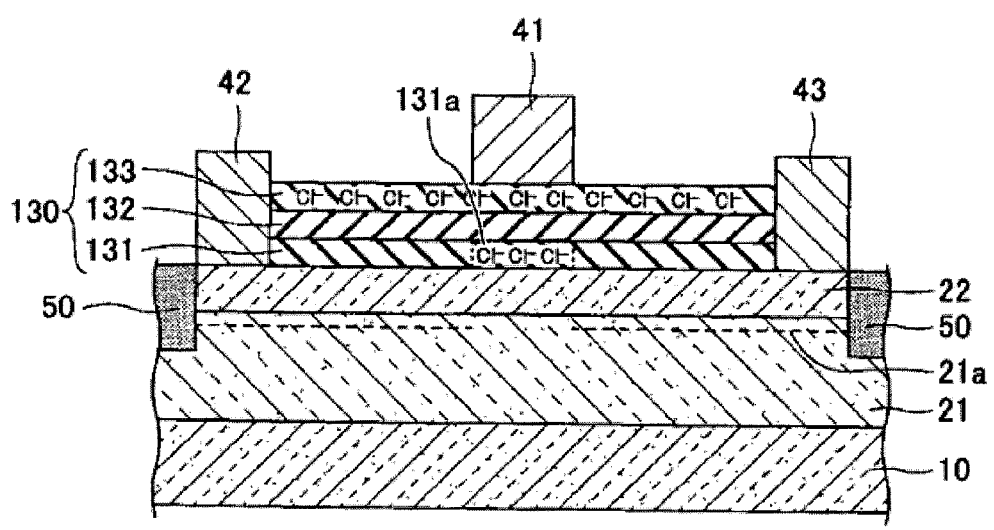

As depicted in FIG. 10B, the resist pattern 62 is removed with an organic solvent or the like and, thereafter, the gate electrode 41 is formed in a predetermined region on the third insulating film 133. Specifically, a photoresist is applied to the third insulating film 133, and exposure and development are performed by an exposing apparatus so as to form a resist pattern (not depicted) which has an opening in a region to be provided with the gate electrode 41. This resist pattern is formed in such a way that the opening is formed at the position above the region 131a containing chlorine ions in the first insulating film 131. Thereafter, a Ni/Au laminated metal film is formed by vacuum evaporation and is immersed in an organic solvent or the like so as to remove the laminated metal film formed on the resist pattern together with the resist pattern by lift-off. Consequently, the gate electrode 41 is formed from the Ni/Au laminated metal film remaining on the third insulating film 133 above the region 131a containing chlorine ions.

In this manner, the semiconductor device according to the second embodiment is allowed to be produced. In the semiconductor device according to the second embodiment, chlorine ions are scarcely implanted or not implanted into the nitride semiconductor layers such as the electron supply layer and the electron transfer layer, so that the nitride semiconductor layers are scarcely damaged. Therefore, in the second embodiment, a semiconductor device which is normally off and which exhibits a stable gate threshold voltage may be obtained. The contents other than those described above are the same as the first embodiment.

Third Embodiment

Semiconductor Device

Figure 11:
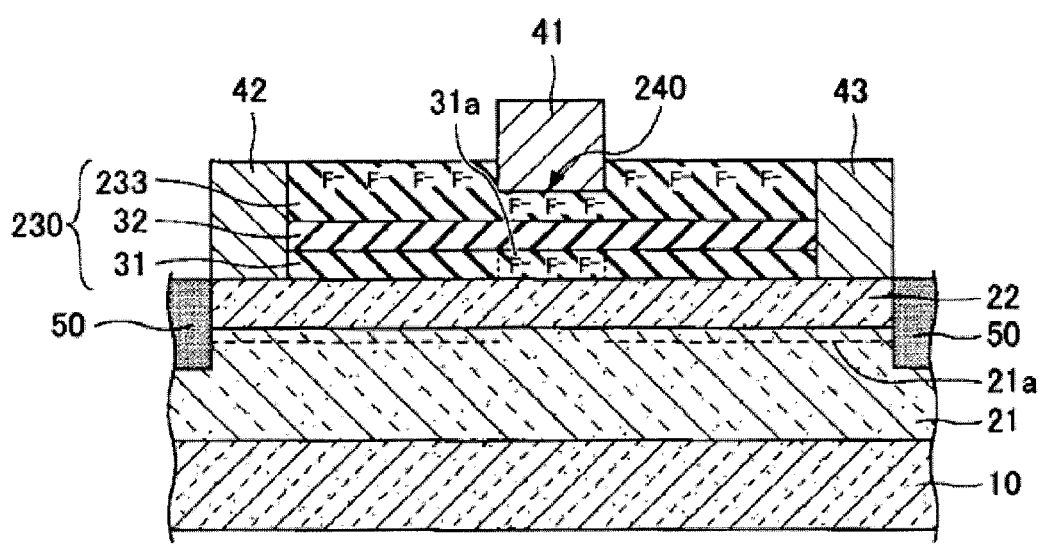
FIG. 11 is a structural diagram of a semiconductor device according to a third embodiment.

Next, a semiconductor device according to a third embodiment is described with reference to FIG. 11. The semiconductor device according to the third embodiment has a structure in which a gate recess is formed under a gate electrode. The threshold voltage of the gate voltage may become positive more reliably by forming such a gate recess. The semiconductor device according to the third embodiment is formed by stacking a buffer layer (not depicted), an electron transfer layer 21, and an electron supply layer 22, which are nitride semiconductor layers, sequentially on a substrate 10 of silicon or the like. Consequently, a 2DEG 21a is formed in the electron transfer layer 21 in the vicinity of the interface between the electron transfer layer 21 and the electron supply layer 22. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm.

An insulating film 230 serving as a gate insulating film formed from a first insulating film 31, a second insulating film 32, and a third insulating film 233 is formed on the electron supply layer 22. The first insulating film 31 is formed from Al2O3, and a region 31a containing fluorine ions (F—) is formed in a region under a gate electrode 41 described later. The second insulating film 32 is formed from Al2O3, and the whole or part of the third insulating film 233 is formed from Al2O3 containing fluorine ions. The gate recess 240 is formed in a predetermined region in the surface of the third insulating film 233, and the gate electrode 41 is formed in the region provided with the gate recess 240. A source electrode 42 and a drain electrode 43 are formed in contact with the electron supply layer 22.

As described above, the semiconductor device according to the third embodiment may be normally off more reliably because the 2DEG 21a in the region under the gate electrode 41 may disappear by forming the region 31a containing fluorine ions in the first insulating film 31 in the region under the gate electrode 41. Meanwhile, in the case where the region 31a containing fluorine ions is formed beyond the region under the gate electrode 41, the region in which the 2DEG 21a disappears extends to a region out of the region under the gate electrode 41 and, thereby, the function as a transistor may not be performed. In the third embodiment, the region 31a containing fluorine ions may be referred to as a region containing halogen ions. In addition, a region containing fluorine ions may be formed almost throughout the third insulating film 233. Element isolation regions 50, which isolate elements from each other, are formed in the electron transfer layer 21 and the electron supply layer 22.

The semiconductor device according to the third embodiment may become normally off and may further exhibit a small fluctuation range of the gate threshold voltage. Because the insulating film 230 in the vicinity of the interface between the insulating film 230 and the electron supply layer 22 and the insulating film 230 in the vicinity of the surface thereof are doped with fluorine ions. In the third embodiment, the gate recess 240 is formed and, therefore, the semiconductor device may be normally off more reliably and the threshold voltage may become high. In the third embodiment, the case where the insulating film 230 is doped with fluorine ions have been explained. However, it is believed that the same effects may also be obtained in the case where ions of halogens, for example, chlorine, bromine, iodine, and astatine, other than fluorine ion are employed.

Manufacturing Method

Next, a method for manufacturing a semiconductor device according to the third embodiment is described with reference to FIG. 12A to FIG. 14C.

Figure 12A:
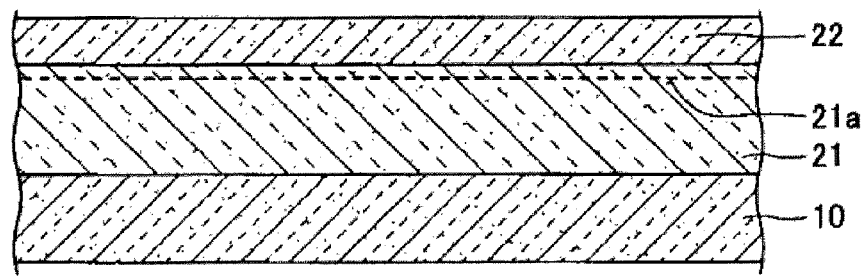
FIGS. 12A to 12C are step diagrams of a method for manufacturing the semiconductor device according to the third embodiment.

As depicted in FIG. 12A, a buffer layer (not depicted), an electron transfer layer 21, and an electron supply layer 22, which are nitride semiconductor layers, are formed on a substrate 10 through epitaxial growth by MOVPE. As for the substrate 10, a substrate of Si, sapphire, SiC, GaN, AlN, or the like may be used. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm. Consequently, a 2DEG 21a is formed in the electron transfer layer 21 in the vicinity of the interface between the electron transfer layer 21 and the electron supply layer 22. In this regard, a cap layer and the like (not depicted) may be formed on the electron supply layer 22, and an intermediate layer and the like may be formed between the electron transfer layer 21 and the electron supply layer 22.

In MOVPE according to the third embodiment, trimethyl gallium (TMG) is used as a raw material gas for Ga, trimethyl aluminum (TMA) is used as a raw material gas for Al, and ammonia (NH3) is used as a raw material gas for N. In the case where parts of the nitride semiconductor layers are formed into the n-type, Si is used as an impurity element, and monosilane (SiH3) or the like is used as a raw material gas for Si. These raw material gases are supplied to a reaction furnace (chamber) of an MOVPE apparatus while hydrogen (H2) is employed as a carrier gas.

Figure 12B:
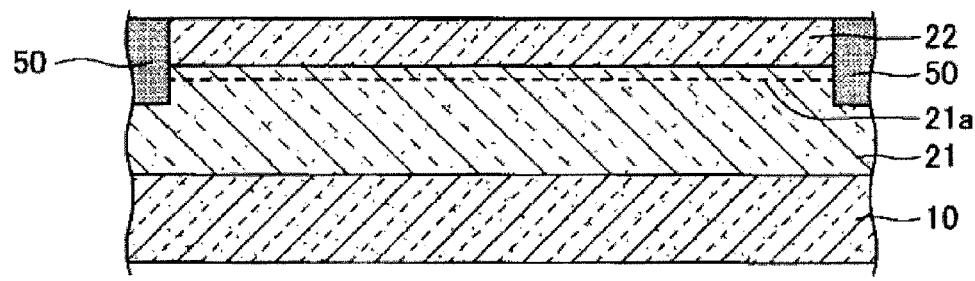

As depicted in FIG. 12B, element isolation regions 50 are formed in the resulting semiconductor layer. Specifically, a photoresist is applied to the electron supply layer 22, and exposure and development are performed by an exposing apparatus so as to form a resist pattern (not depicted) which has openings in regions to be provided with the element isolation regions 50. Thereafter, the element isolation regions 50 are formed by dry etching with a chlorine base gas and embedding of an insulating material, or ion implantation. After the element isolation regions 50 are formed, the resist pattern is removed with an organic solvent or the like.

Figure 12C:
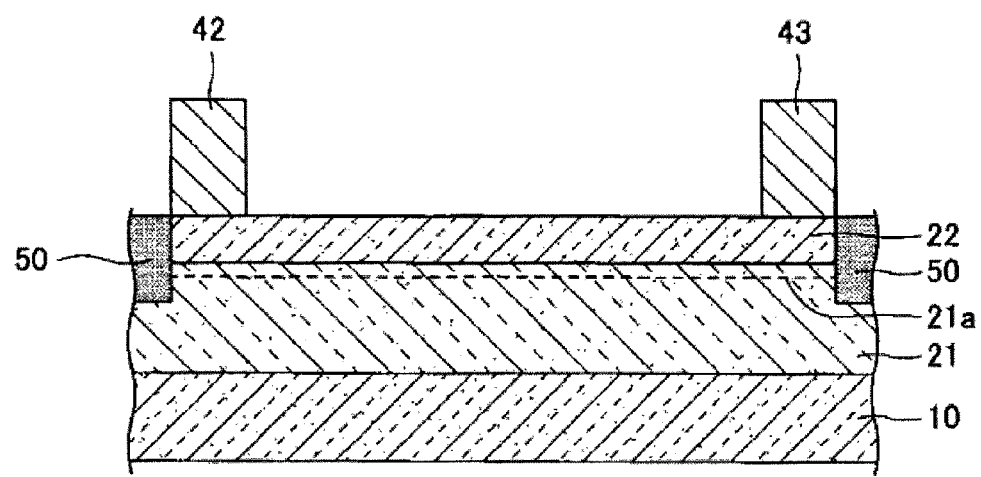

As depicted in FIG. 12C, a source electrode 42 and a drain electrode 43 are formed on the electron supply layer 22. Specifically, a photoresist is applied to the electron supply layer 22, and exposure and development are performed by an exposing apparatus so as to form a resist pattern (not depicted) which has openings in regions to be provided with the source electrode 42 and the drain electrode 43. Thereafter, a Ti/Al laminated metal film is formed by vacuum evaporation and is immersed in an organic solvent or the like so as to remove the laminated metal film formed on the resist pattern together with the resist pattern by lift-off. Consequently, the source electrode 42 and the drain electrode 43 are formed from the Ti/Al laminated metal film remaining on the electron supply layer 22. Subsequently, a heat treatment is performed at a temperature of about 700° C. and, thereby, the source electrode 42 and the drain electrode 43 are brought into ohmic contact.

Figure 13A:
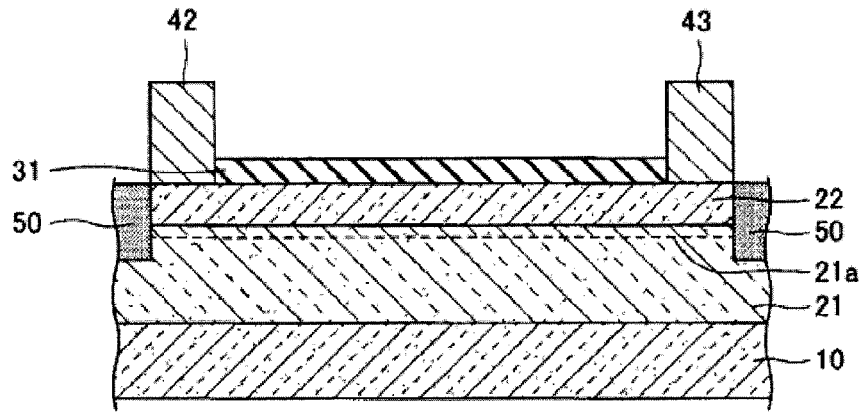
FIGS. 13A to 13C are step diagrams of the method for manufacturing the semiconductor device according to the third embodiment.

As depicted in FIG. 13A, a first insulating film 31 is formed. Specifically, a film of Al2O3 having a thickness of 10 nm is formed on the electron supply layer 22 by ALD. The methods for manufacturing the first insulating film 31 may include film formation methods, for example, plasma CVD, thermal CVD, MOCVD, sputtering, and electron beam evaporation, other than ALD. Examples of materials for forming the first insulating film 31 include oxides, nitrides, and oxynitrides. The first insulating film 31 may be formed from SiO2, HfO2, Ta2O5, ZrO2, MgO, SiN, AlN, SiON, or AlON instead of Al2O3. The film thickness of the first insulating film 31 is not limited to the above-described film thickness. After the first insulating film 31 is formed, a heat treatment or the like may be performed.

Figure 13B:
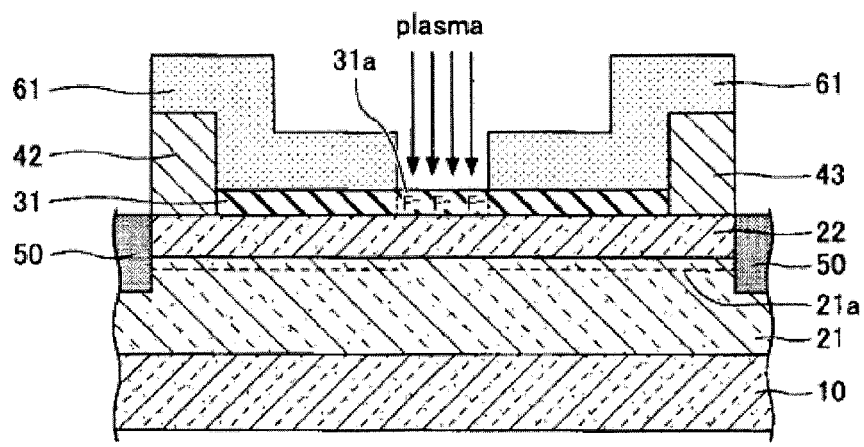

As depicted in FIG. 13B, a region 31a containing fluorine ions is formed in a region in the first insulating film 31 under the region to be provided with a gate electrode 41, described later, by implanting fluorine ions. Specifically, a photoresist is applied to the surface of the first insulating film 31, and exposure and development are performed by an exposing apparatus so as to form a resist pattern 61 which has an opening to become a region under the gate electrode 41, described later. Then, plasma irradiation is performed using CF4. As for the condition of the plasma irradiation performed at this time, the flow rate of CF4 is 15 sccm, the pressure in a chamber is 3 Pa, the applied voltage is 50 W, and the irradiation time is 5 minutes. In this manner, fluorine ions (F—) are allowed to be implanted into only a region not provided with the resist pattern 61 so as to form the region 31a containing fluorine ions. The concentration of fluorine ions implanted at this time is $1\times10^{15}$ to $1\times10^{19}$ cm-3, and examples of gases used for plasma irradiation include SF6, NF3, and F2 in addition to CF4. The region 31a containing fluorine ions may be formed by ion implantation of fluorine ions instead of plasma irradiation. In this regard, if the fluorine ions are implanted up to the nitride semiconductor layer, for example, the electron supply layer 22 that is deeper than the first insulating film 31, the nitride semiconductor layer may be damaged and the characteristics and the like may be adversely affected. Therefore, it is preferable that fluorine ions be scarcely implanted into the nitride semiconductor layer and be implanted into only the region 31a containing fluorine ions in the first insulating film 31. Meanwhile, in the third embodiment, plasma irradiation using CF4 may be referred to as plasma irradiation using a halogen compound, and ion implantation of fluorine ions may be referred to as ion implantation of halogen ions.

Figure 13C:
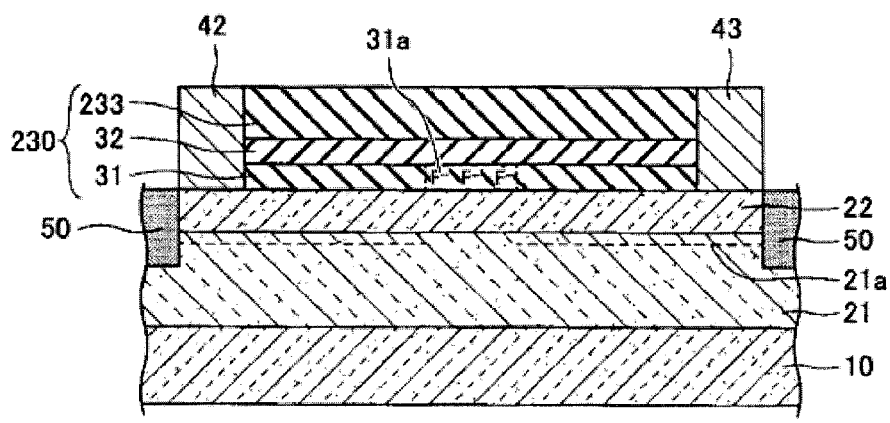

As depicted in FIG. 13C, the resist pattern 61 is removed with an organic solvent or the like and, thereafter, a second insulating film 32 and a third insulating film 233 are formed on the first insulating film 31. Specifically, a film of Al2O3 having a thickness of 20 nm is formed on the first insulating film 31 by ALD, so as to form the second insulating film 32.

In addition, the third insulating film 233 is formed on the second insulating film 32 by forming a film of Al2O3 having a thickness of 20 nm. The methods for manufacturing the second insulating film 32 and the third insulating film 233 include film formation methods, for example, plasma CVD, thermal CVD, MOCVD, sputtering, and electron beam evaporation, other than ALD. Examples of materials for forming the second insulating film 32 and the third insulating film 233 include oxides, nitrides, and oxynitrides, and may be SiO2, HfO2, Ta2O5, ZrO2, MgO, SiN, AlN, SiON, or AlON instead of Al2O3. In this regard, the second insulating film 32 and the third insulating film 233 may be formed by continuous film formation.

Figure 14A:
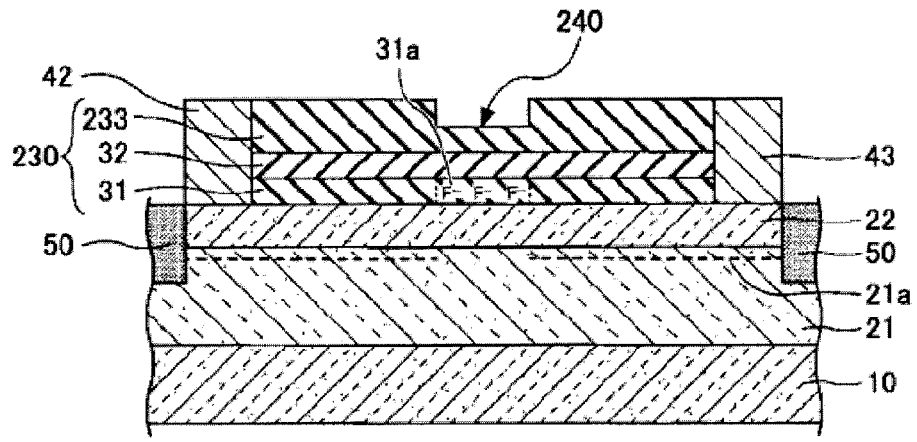
FIGS. 14A to 14C are step diagrams of the method for manufacturing the semiconductor device according to the third embodiment.

As depicted in FIG. 14A, a gate recess 240 is formed in the third insulating film 233. Specifically, a photoresist is applied to the surface of the third insulating film 233, and exposure and development are performed by an exposing apparatus so as to form a resist pattern (not depicted) which has an opening in a region to be provided with the gate recess 240. This resist pattern is formed in such a way that the opening is formed at the position above the region 31a containing fluorine ions in the first insulating film 31. The resulting resist pattern (not depicted) is used as a mask, and in the region not provided with the resist pattern, the third insulating film 233 is removed by wet etching in such a way that the depth of the third insulating film 233 becomes about 10 nm. In this wet etching, a TMAH solution is used as an etching solution. The method for removing part of the third insulating film 233 may be other than the wet etching, and may be, for example, dry etching using a chlorine base gas. In this manner, the gate recess 240 may be formed in a region under the region to be provided with the gate electrode 41, described later, in the third insulating film 233.

Figure 14B:
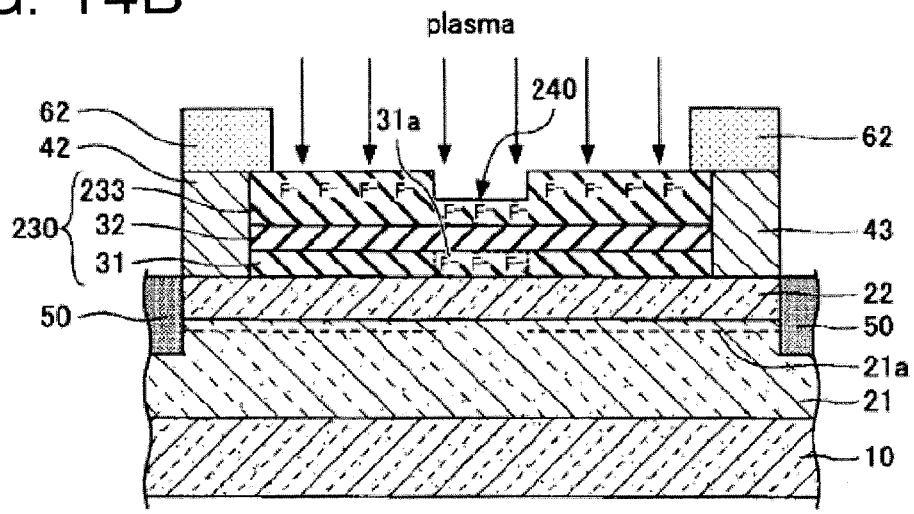

As depicted in FIG. 14B, fluorine ions are implanted into the third insulating film 233. Specifically, a photoresist is applied to the surface of the third insulating film 233, and exposure and development are performed by an exposing apparatus so as to form a resist pattern 62 on the regions provided with the source electrode 42 and the drain electrode 43. Then, plasma irradiation is performed using CF4. As for the condition of the plasma irradiation performed at this time, the flow rate of CF4 is 15 sccm, the pressure in a chamber is 3 Pa, the applied voltage is 50 W, and the irradiation time is 5 minutes. In this manner, fluorine ions are implanted into a region not provided with the resist pattern 62. The concentration of fluorine ions implanted at this time is $1\times10^{15}$ to $1\times10^{19}$ cm-3, and examples of gases used for plasma irradiation include SF6, NF3, and F2 in addition to CF4. Fluorine ions may be implanted into the third insulating film 233 by ion implantation of fluorine ions instead of plasma irradiation. In this regard, it is preferable that fluorine ions be implanted within the region of the third insulating film 233. In addition, it is preferable that the third insulating film 233 implanted with fluorine ions and the region 31a containing fluorine ions in the first insulating film 31 be separated by the second insulating film 32.

Figure 14C:
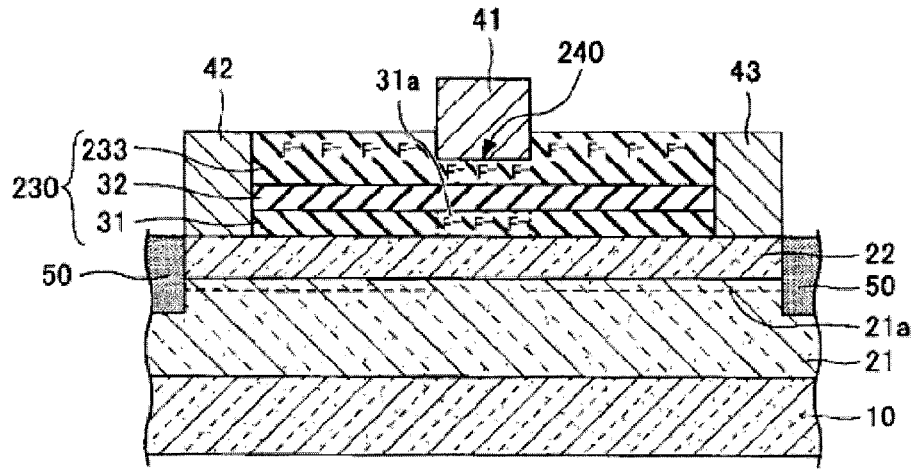

As depicted in FIG. 14C, the resist pattern 62 is removed with an organic solvent or the like and, thereafter, the gate electrode 41 is formed in the region provided with the gate recess 240 in the third insulating film 233. Specifically, a photoresist is applied to the third insulating film 233, and exposure and development are performed by an exposing apparatus so as to form a resist pattern (not depicted) which has an opening in a region to be provided with the gate electrode 41, that is, a region provided with the gate recess 240. This resist pattern is formed in such a way that the opening is formed at the position above the region 31a containing fluorine ions in the first insulating film 31. Thereafter, a Ni/Au laminated metal film is formed by vacuum evaporation and is immersed in an organic solvent or the like so as to remove the laminated metal film formed on the resist pattern together with the resist pattern by lift-off. Consequently, the gate electrode 41 is formed from the Ni/Au laminated metal film remaining in the region provided with the gate recess 240 in the third insulating film 233.

In this manner, the semiconductor device according to the third embodiment is allowed to be produced. In the semiconductor device according to the third embodiment, fluorine ions are scarcely implanted or not implanted into the nitride semiconductor layers such as the electron supply layer and the electron transfer layer, so that the nitride semiconductor layers are scarcely damaged. Therefore, in the third embodiment, a semiconductor device which is normally off and which exhibits a stable gate threshold voltage may be obtained. In addition, the semiconductor device according to the third embodiment may be readily normally off because the gate recess 240 is formed. The structures other than those described above are the same as those of the first embodiment.

Fourth Embodiment

Figure 15:
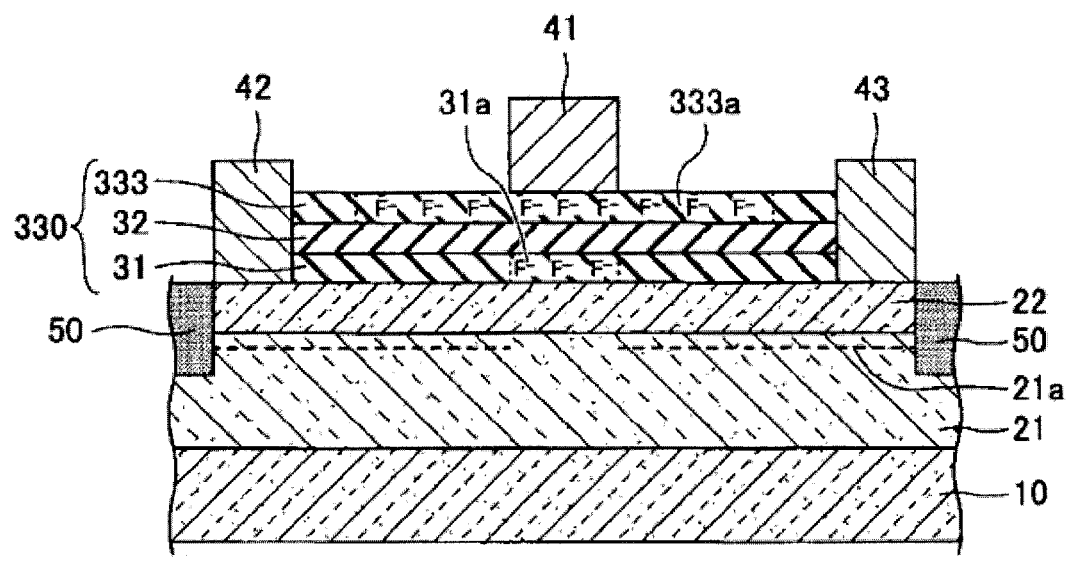
FIG. 15 is a structural diagram of a semiconductor device according to a fourth embodiment.

Next, a fourth embodiment is described. The semiconductor device according to the fourth embodiment has a structure in which a region containing fluorine ions is formed in a third insulating film by implanting fluorine ions into part of the third insulating film. The semiconductor device according to the fourth embodiment is described with reference to FIG. 15.

The semiconductor device according to the fourth embodiment is formed by stacking a buffer layer (not depicted), an electron transfer layer 21, and an electron supply layer 22, which are nitride semiconductor layers, sequentially on a substrate 10 of silicon or the like. Consequently, a 2DEG 21a is formed in the electron transfer layer 21 in the vicinity of the interface between the electron transfer layer 21 and the electron supply layer 22. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm.

An insulating film 330 serving as a gate insulating film formed from a first insulating film 31, a second insulating film 32, and a third insulating film 333 is formed on the electron supply layer 22. The first insulating film 31 is formed from Al2O3, and a region 31a containing fluorine ions (F—) is formed in a region under a gate electrode 41 described later. The second insulating film 32 is formed from Al2O3, the third insulating film 333 is formed from Al2O3, and a region 333a, which does not come into contact with a source electrode 42 and a drain electrode 43, described later, and which contains fluorine ions, is formed. The gate electrode 41 is formed in a predetermined region on the surface of the third insulating film 333, and the source electrode 42 and the drain electrode 43 are formed in contact with the electron supply layer 22.

As described above, the semiconductor device according to the fourth embodiment may be normally off because the 2DEG 21a in the region under the gate electrode 41 may disappear by forming the region 31a containing fluorine ions in the first insulating film 31 in the region under the gate electrode 41. Meanwhile, in the case where the region 31a containing fluorine ions is formed beyond the region under the gate electrode 41, the region in which the 2DEG 21a disappears extends to a region out of the region under the gate electrode 41 and, thereby, the function as a transistor may not be performed. In the fourth embodiment, the region 31a containing fluorine ions may be referred to as a first region containing halogen ions and the region 333a containing fluorine ions may be referred to as a second region containing halogen ions. Element isolation regions 50, which isolate elements from each other, are formed in the electron transfer layer 21 and the electron supply layer 22.

In the third insulating film 333 according to the fourth embodiment, the region 333a, which does not come into contact with the source electrode 42 and the drain electrode 43 and which contains fluorine ions, is formed as part of the third insulating film 333. The breakdown voltage between the source and drain may be improved by forming the region 333a, which does not come into contact with the source electrode 42 and the drain electrode 43 and which contains fluorine ions, in the third insulating film 333, as described above. In the fourth embodiment, the case where the insulating film 330 is doped with fluorine ions have been explained. However, it is believed that the same effects may also be obtained in the case where ions of halogens, for example, chlorine, bromine, iodine, and astatine, other than fluorine ion are employed.

The semiconductor device according to the fourth embodiment may be produced by forming the resist pattern 62 larger than that formed in the manufacturing method according to the first embodiment. That is, the resist pattern 62 depicted in FIG. 6A may be formed having a size larger than the size of that formed in the first embodiment and, thereafter, fluorine ion implantation and the like may be performed similarly to the manufacturing method according to the first embodiment so as to produce the semiconductor device.

The structures other than those described above are similar to those of the first embodiment. The fourth embodiment may also be applied to the second embodiment and the third embodiment.

Fifth Embodiment

Next, a fifth embodiment is described. The fifth embodiment is a method for manufacturing the semiconductor device according to the first embodiment, and this method is different from the method for manufacturing a semiconductor device according to the first embodiment. The method for manufacturing a semiconductor device according to the fifth embodiment is described with reference to FIG. 16A to FIG. 18B.

Figure 16A:
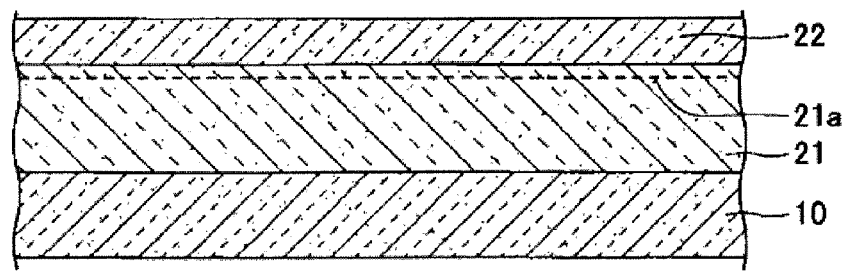
FIGS. 16A to 16C are step diagrams of a method for manufacturing the semiconductor device according to the fifth embodiment.

As depicted in FIG. 16A, a buffer layer (not depicted), an electron transfer layer 21, and an electron supply layer 22, which are nitride semiconductor layers, are formed on a substrate 10 through epitaxial growth by MOVPE. As for the substrate 10, a substrate of Si, sapphire, SiC, GaN, AlN, or the like may be used. The electron transfer layer 21 is formed from intentionally undoped GaN (i-GaN) having a thickness of 3 μm, and the electron supply layer 22 is formed from intentionally undoped Al0.25Ga0.75N (i-Al0.25Ga0.75N) having a thickness of 20 nm. Consequently, a 2DEG 21a is formed in the electron transfer layer 21 in the vicinity of the interface between the electron transfer layer 21 and the electron supply layer 22. In this regard, a cap layer and the like (not depicted) may be formed on the electron supply layer 22, and an intermediate layer and the like may be formed between the electron transfer layer 21 and the electron supply layer 22.

In MOVPE according to the fifth embodiment, trimethyl gallium (TMG) is used as a raw material gas for Ga, trimethyl aluminum (TMA) is used as a raw material gas for Al, and ammonia (NH3) is used as a raw material gas for N. In the case where parts of the nitride semiconductor layers are formed into the n-type, Si is used as an impurity element, and monosilane (SiH3) or the like is used as a raw material gas for Si. These raw material gases are supplied to a reaction furnace (chamber) of an MOVPE apparatus while hydrogen (H2) is employed as a carrier gas.

Figure 16B:
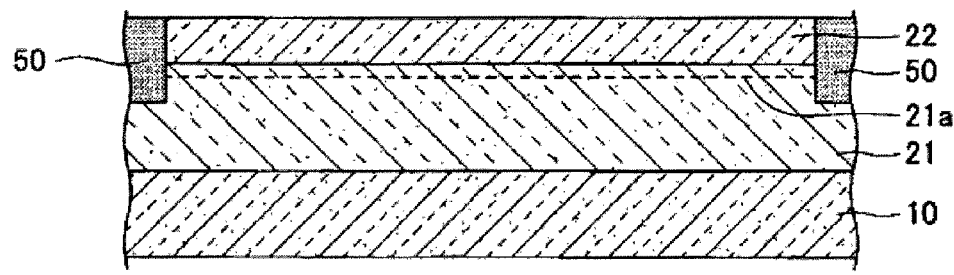

As depicted in FIG. 16B, element isolation regions 50 are formed in the resulting semiconductor layer. Specifically, a photoresist is applied to the electron supply layer 22, and exposure and development are performed by an exposing apparatus so as to form a resist pattern (not depicted) which has openings in regions to be provided with the element isolation regions 50. Thereafter, the element isolation regions 50 are formed by dry etching with a chlorine base gas and embedding of an insulating material, or ion implantation. After the element isolation regions 50 are formed, the resist pattern is removed with an organic solvent or the like.

Figure 16C:
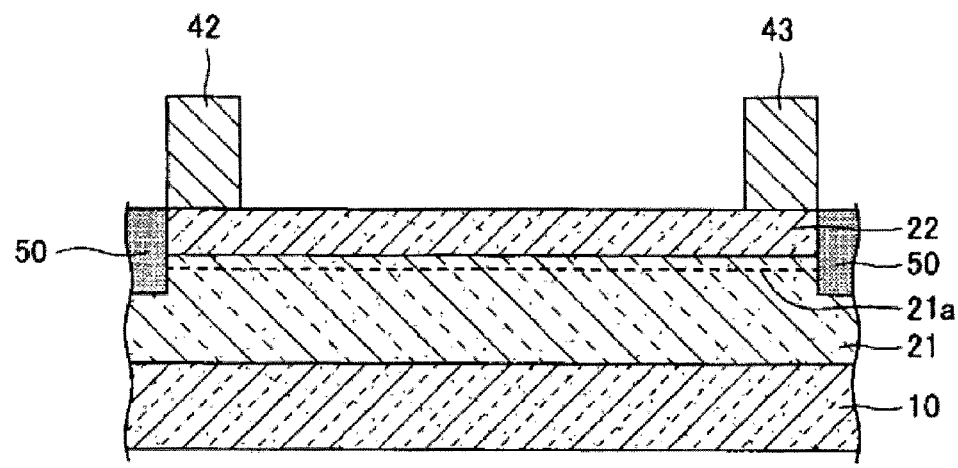

As depicted in FIG. 16C, a source electrode 42 and a drain electrode 43 are formed on the electron supply layer 22. Specifically, a photoresist is applied to the electron supply layer 22, and exposure and development are performed by an exposing apparatus so as to form a resist pattern (not depicted) which has openings in regions to be provided with the source electrode 42 and the drain electrode 43. Thereafter, a Ti/Al laminated metal film is formed by vacuum evaporation and is immersed in an organic solvent or the like so as to remove the laminated metal film formed on the resist pattern together with the resist pattern by lift-off. Consequently, the source electrode 42 and the drain electrode 43 are formed from the Ti/Al laminated metal film remaining on the electron supply layer 22. Subsequently, a heat treatment is performed at a temperature of about 700° C. and, thereby, the source electrode 42 and the drain electrode 43 are brought into ohmic contact.

Figure 17A:
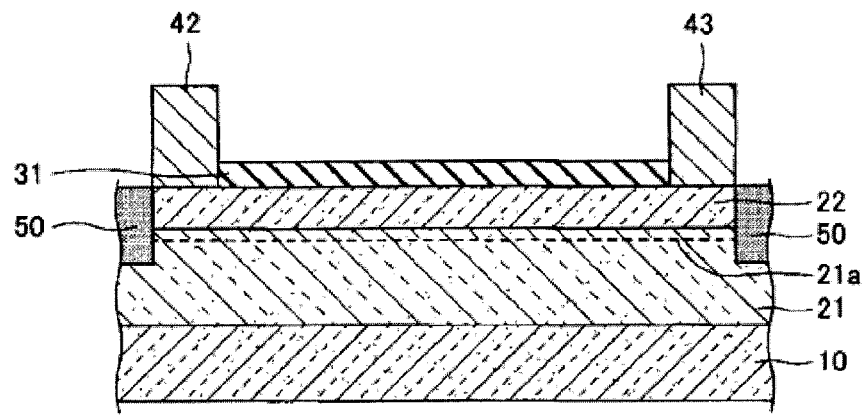
FIGS. 17A to 17C are step diagrams of the method for manufacturing the semiconductor device according to the fifth embodiment.

As depicted in FIG. 17A, a first insulating film 31 is formed. Specifically, a film of Al2O3 having a thickness of 10 nm is formed on the electron supply layer 22 by ALD. The methods for manufacturing the first insulating film 31 may include film formation methods, for example, plasma CVD, thermal CVD, MOCVD, sputtering, and electron beam evaporation, other than ALD. Examples of materials for forming the first insulating film 31 include oxides, nitrides, and oxynitrides. The first insulating film 31 may be formed from SiO2, HfO2, Ta2O5, ZrO2, MgO, SiN, AlN, SiON, or AlON instead of Al2O3. The film thickness of the first insulating film 31 is not limited to the above-described film thickness. After the first insulating film 31 is formed, a heat treatment or the like may be performed.

Figure 17B:
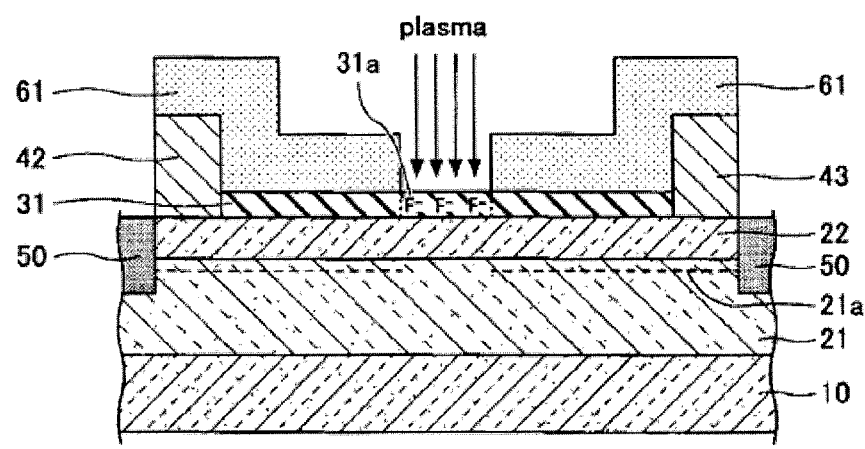

As depicted in FIG. 17B, a region 31a containing fluorine ions is formed in a region in the first insulating film 31 under the region to be provided with a gate electrode 41, described later, by implanting fluorine ions. Specifically, a photoresist is applied to the surface of the first insulating film 31, and exposure and development are performed by an exposing apparatus so as to form a resist pattern 61 which has an opening to become a region under the gate electrode 41, described later. Then, plasma irradiation is performed using CF4. As for the condition of the plasma irradiation performed at this time, the flow rate of CF4 is 15 sccm, the pressure in a chamber is 3 Pa, the applied voltage is 50 W, and the irradiation time is 5 minutes. In this manner, fluorine ions (F—) are allowed to be implanted into only a region not provided with the resist pattern 61 so as to form the region 31a containing fluorine ions. The concentration of fluorine ions implanted at this time is $1\times10^{15}$ to $1\times10^{19}$ cm-3, and examples of gases used for plasma irradiation include SF6, NF3, and F2 in addition to CF4. The region 31a containing fluorine ions may be formed by ion implantation of fluorine ions instead of plasma irradiation. In this regard, if the fluorine ions are implanted up to the nitride semiconductor layer, for example, the electron supply layer 22 that is deeper than the first insulating film 31, the nitride semiconductor layer may be damaged and the characteristics and the like may be adversely affected. Therefore, it is preferable that fluorine ions be scarcely implanted into the nitride semiconductor layer and be implanted into only the region 31a containing fluorine ions in the first insulating film 31.

Figure 17C:
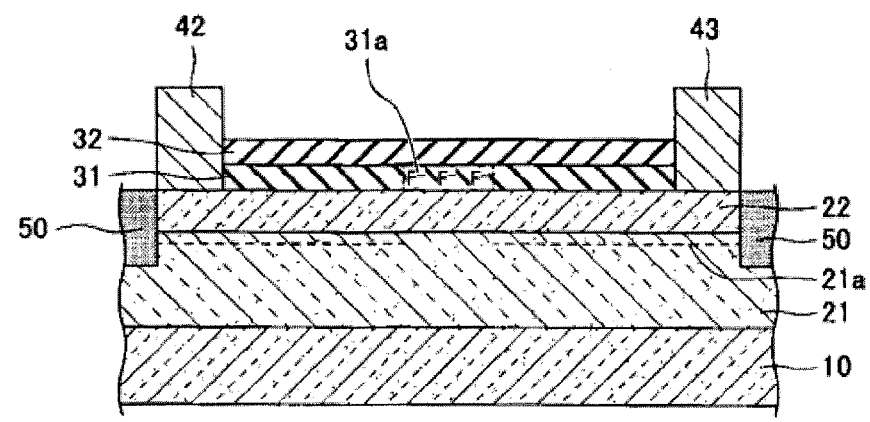

As depicted in FIG. 17C, the resist pattern 61 is removed with an organic solvent or the like and, thereafter, a second insulating film 32 is formed on the first insulating film 31. Specifically, a film of Al2O3 having a thickness of 15 nm is formed on the first insulating film 31 by ALD so as to form the second insulating film 32. The methods for manufacturing the second insulating film 32 include film formation methods, for example, plasma CVD, thermal CVD, MOCVD, sputtering, and electron beam evaporation, other than ALD. Examples of materials for forming the second insulating film 32 include oxides, nitrides, and oxynitrides, and may be SiO2, HfO2, Ta2O5, ZrO2, MgO, SiN, AlN, SiON, or AlON instead of Al2O3.

Figure 18A:
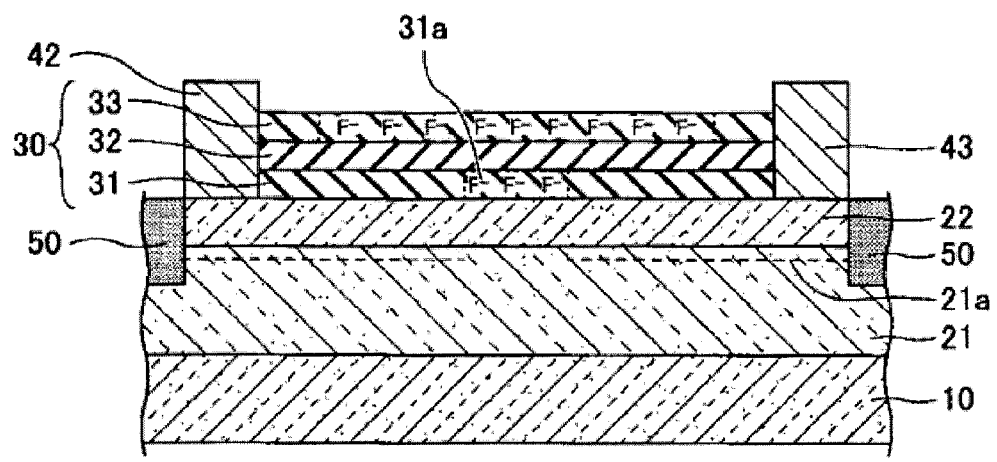
FIGS. 18A and 18B are step diagrams of the method for manufacturing the semiconductor device according to the fifth embodiment.

As depicted in FIG. 18A, a third insulating film 33 is formed on the second insulating film 32 by forming a film of Al2O3 having a thickness of 15 nm and containing fluorine. Specifically, when forming the third insulating film 33, the third insulating film 33 is formed while a gas containing a fluorine compound, in addition to a material for forming Al2O3, is added to have a predetermined amount of doping. Consequently, the third insulating film 33 is formed from Al2O3 containing fluorine ions. The methods for manufacturing the third insulating film 33 include film formation methods, for example, plasma CVD, thermal CVD, MOCVD, sputtering, and electron beam evaporation, other than ALD. Examples of materials for forming the third insulating film 33 include oxides, nitrides, and oxynitrides, and may be SiO2, HfO2, Ta2O5, ZrO2, MgO, SiN, AlN, SiON, or AlON instead of Al2O3. In this manner, the insulating film 30 is formed from the first insulating film 31, the second insulating film 32, and the third insulating film 33.

Figure 18B:
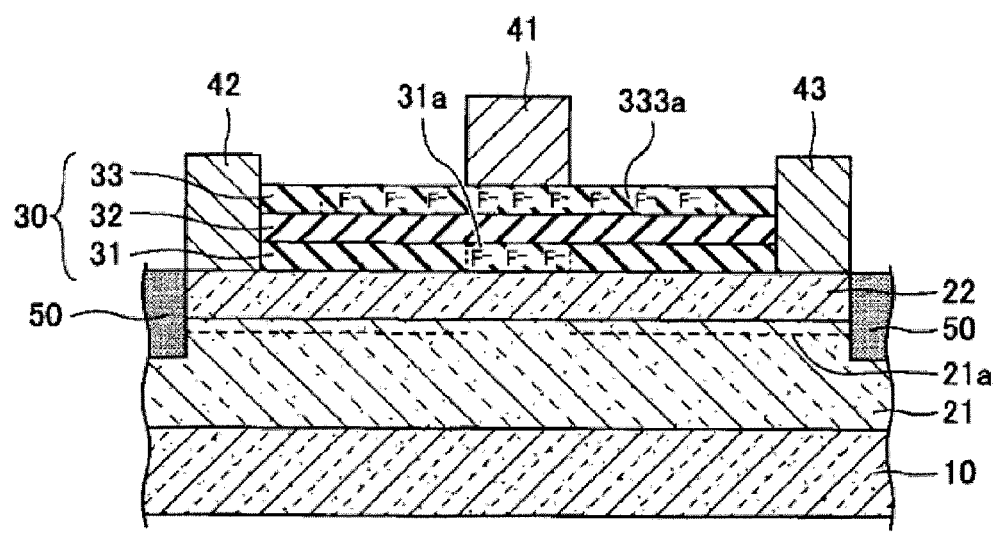

As depicted in FIG. 18B, the resist pattern 62 is removed with an organic solvent or the like and, thereafter, a gate electrode 41 is formed in a predetermined region on the third insulating film 33. Specifically, a photoresist is applied to the third insulating film 33, and exposure and development are performed by an exposing apparatus so as to form a resist pattern (not depicted) which has an opening in a region to be provided with the gate electrode 41. This resist pattern is formed in such a way that the opening is formed at the position above the region 31a containing fluorine ions in the first insulating film 31. Thereafter, a Ni/Au laminated metal film is formed by vacuum evaporation and is immersed in an organic solvent or the like is performed so as to remove the laminated metal film formed on the resist pattern together with the resist pattern by lift-off. Consequently, the gate electrode 41 is formed from the Ni/Au laminated metal film remaining on the third insulating film 33 above the region 31a containing fluorine ions.

In this manner, the semiconductor device according to the fifth embodiment is allowed to be produced. In the semiconductor device according to the fifth embodiment, fluorine ions are scarcely implanted or not implanted into the nitride semiconductor layers, for example, the electron supply layer and the electron transfer layer, so that the nitride semiconductor layers are scarcely damaged.

In the fifth embodiment, the resist pattern 62 in the first embodiment or equivalent is not used, so that the production process may be simplified and the semiconductor device according to the first embodiment may be produced at a low cost. The structures other than those described above are the same as the first embodiment. The fifth embodiment may also be applied to the second embodiment and the third embodiment.

Sixth Embodiment

Next, a sixth embodiment is described. The sixth embodiment relates to a semiconductor device, a power supply apparatus, and a high-frequency amplifier.

Semiconductor Device

Figure 19:
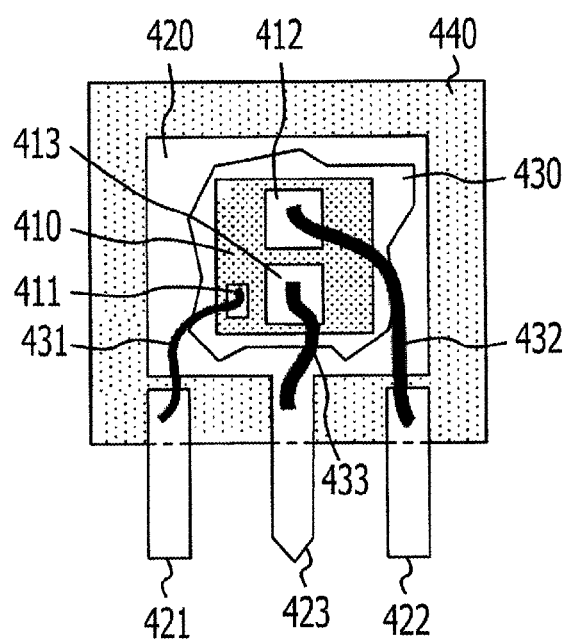
FIG. 19 is an explanatory diagram of a semiconductor device according to a sixth embodiment.

The semiconductor device according to the sixth embodiment is produced by discrete-packaging the semiconductor device according to one of the first to fifth embodiments. The thus discretely packaged semiconductor device is described with reference to FIG. 19. In this regard, FIG. 19 schematically depicts the inside of the discretely packaged semiconductor device, and the arrangement of electrodes and the like are different from the arrangements described in the first to fifth embodiments.

The semiconductor device produced in one of the first to fifth embodiments is cut by dicing or the like so as to produce a semiconductor chip 410 of a HEMT of a GaN base semiconductor material. The semiconductor chip 410 is fixed to a lead frame 420 with a die-attach agent 430, for example, solder. The semiconductor chip 410 corresponds to the semiconductor device according to one of the first to fifth embodiments.

A gate electrode 411 is connected to a gate lead 421 with a bonding wire 431, a source electrode 412 is connected to a source lead 422 with a bonding wire 432, and a drain electrode 413 is connected to a drain lead 423 with a bonding wire 433. The bonding wires 431, 432, and 433 are formed from a metal material, for example, Al. In the sixth embodiment, the gate electrode 411 is one type of a gate electrode pad and is connected to the gate electrode 41 of the semiconductor device according to one of the first to fifth embodiments. The source electrode 412 is one type of a source electrode pad and is connected to the source electrode 42 of the semiconductor device according to one of the first to fifth embodiments. The drain electrode 413 is one type of a drain electrode pad and is connected to the drain electrode 43 of the semiconductor device according to one of the first to fifth embodiments.

Resin sealing with a mold resin 440 is performed by a transfer mold method. In this manner, a discretely packaged semiconductor device of a HEMT by using a GaN base semiconductor material may be produced.

Power factor correction circuit, power supply apparatus, and high-frequency amplifier Next, a power factor correction (PFC) circuit, a power supply apparatus, and a high-frequency amplifier according to the sixth embodiment are described. The PFC circuit, the power supply apparatus, and the high-frequency amplifier according to the sixth embodiment are the PFC circuit, the power supply apparatus, and the high-frequency amplifier including one of semiconductor devices according to the first to fifth embodiments.

PFC Circuit

The PFC circuit according to the sixth embodiment is described. The PFC circuit according to the sixth embodiment includes the semiconductor device according to one of the first to fifth embodiments.

Figure 20:
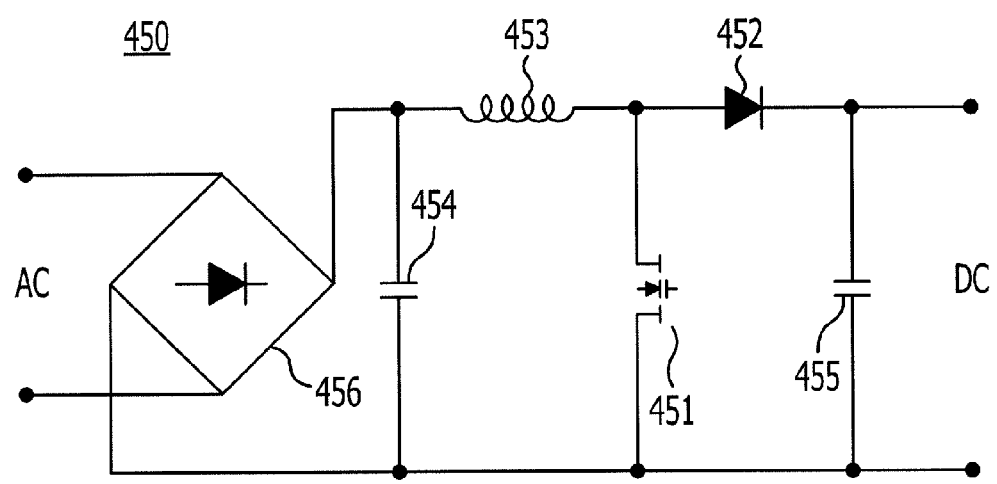
FIG. 20 is a circuit diagram of a PFC circuit according to the sixth embodiment.

The PFC circuit according to the sixth embodiment is described with reference to FIG. 20. The PFC circuit 450 according to the sixth embodiment includes a switch element (transistor) 451, a diode 452, a choke coil 453, capacitors 454 and 455, a diode bridge 456, and an alternating current power supply (not depicted). The HEMT, which is the semiconductor device according to one of the first to fifth embodiments, is used for the switch element 451.

In the PFC circuit 450, the drain electrode of the switch element 451, the anode terminal of the diode 452, and one terminal of the choke coil 453 are connected. In addition, the source electrode of the switch element 451, one terminal of the capacitor 454, and one terminal of the capacitor 455 are connected, and the other terminal of the capacitor 454 and the other terminal of the choke coil 453 are connected. The other terminal of the capacitor 455 and the cathode terminal of the diode 452 are connected, and the alternating current power supply (not depicted) is connected between the two terminals of the capacitor 454 through the diode bridge 456. In the above-described PFC circuit 450, a direct current (DC) is output from between the two terminals of the capacitor 455.

Power Supply Apparatus

The power supply apparatus according to the sixth embodiment is described. The power supply apparatus according to the sixth embodiment is a power supply apparatus including the HEMT, which is the semiconductor device according to one of the first to fifth embodiments.

Figure 21:
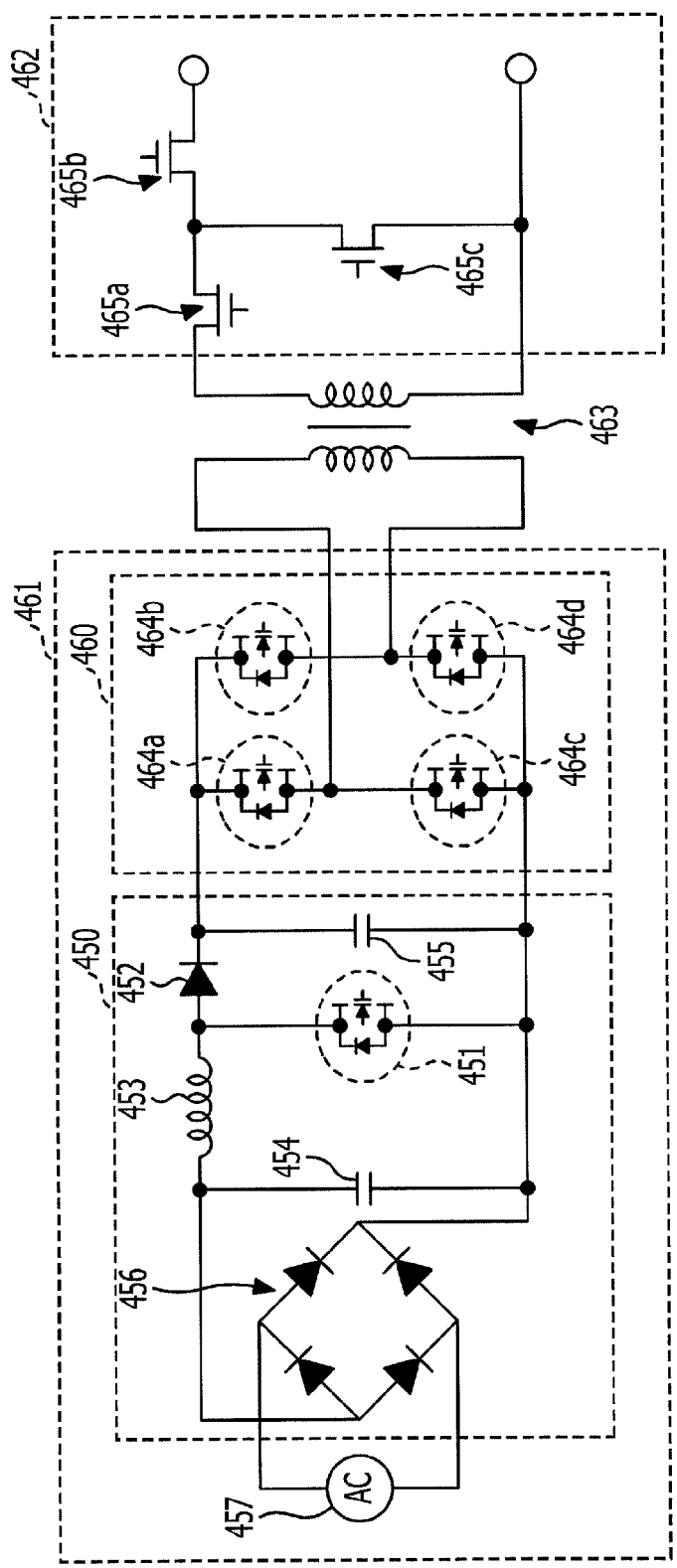
FIG. 21 is a circuit diagram of a power supply apparatus according to the sixth embodiment.

The power supply apparatus according to the sixth embodiment is described with reference to FIG. 21. The power supply apparatus according to the sixth embodiment has a structure including the above-described PFC circuit 450 according to the sixth embodiment.

The power supply apparatus according to the sixth embodiment includes a high-voltage primary circuit 461, a low-voltage secondary circuit 462, and a transformer 463 formed between the primary circuit 461 and the secondary circuit 462.

The primary circuit 461 includes the above-described PFC circuit 450 according to the sixth embodiment and an inverter circuit, for example, a full bridge inverter circuit 460, connected between the two terminals of the capacitor 455 of the PFC circuit 450. The full bridge inverter circuit 460 includes a plurality of, in this case four, switch elements 464a, 464b, 464c, and 464d. The secondary circuit 462 includes a plurality of, in this case three, switch elements 465a, 465b, and 465c. An alternating current power supply 457 is connected to the diode bridge 456.

In the sixth embodiment, the HEMT, which is the semiconductor device according to one of the first to fifth embodiments, is used in the switch element 451 of the PFC circuit 450 in the primary circuit 461. In addition, the HEMT, which is the semiconductor device according to one of the first to fifth embodiments, is used in the switch elements 464a, 464b, 464c, and 464d in the full bridge inverter circuit 460. Meanwhile, a FET having a common MIS structure using silicon is used for the switch elements 465a, 465b, and 465c in the secondary circuit 462.

High-Frequency Amplifier

The high-frequency amplifier according to the sixth embodiment is described. The high-frequency amplifier according to the sixth embodiment has a structure including the HEMT, which is the semiconductor device according to one of the first to fifth embodiments.

Figure 22:
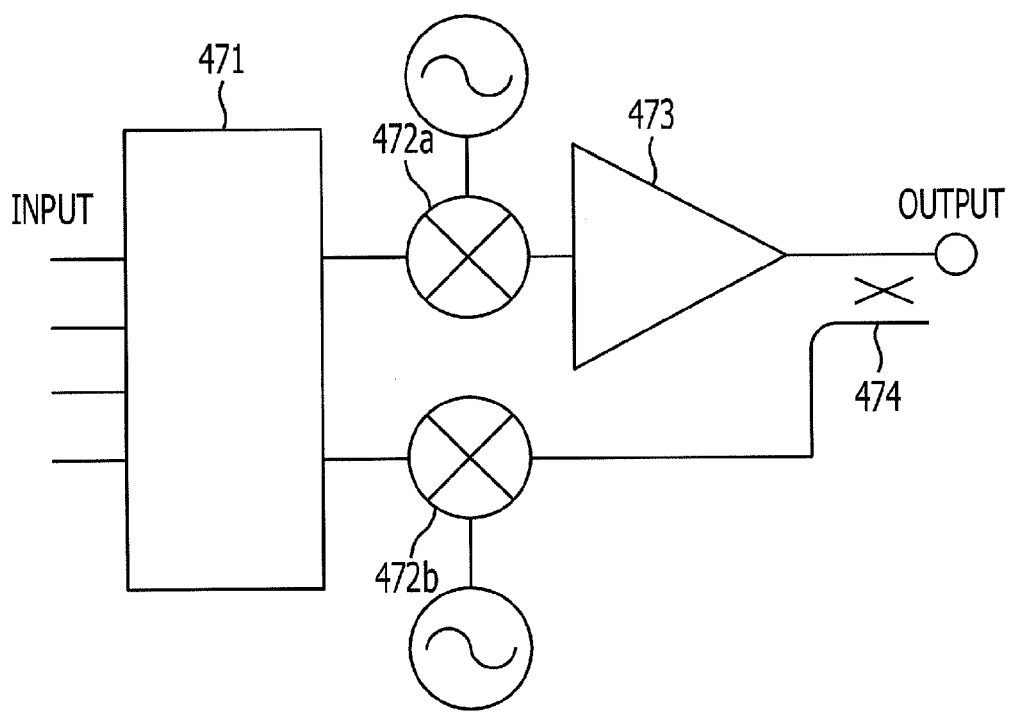
FIG. 22 is a structural diagram of a high-output amplifier according to the sixth embodiment.

The high-frequency amplifier 470 according to the sixth embodiment is described with reference to FIG. 22. The high-frequency amplifier 470 according to the sixth embodiment includes a digital predistortion circuit 471, mixers 472a and 472b, a power amplifier 473, and a directional coupler 474.

The digital predistortion circuit 471 compensates for nonlinear distortion of an input signal. The mixer 472a mixes the input signal, in which nonlinear distortion has been compensated for, and an alternating current signal. The power amplifier 473 amplifies the input signal mixed with the alternating current signal and includes the HEMT, which is the semiconductor device according to one of the first to fifth embodiments. The directional coupler 474 performs, for example, monitoring of the input signal and the output signal. In FIG. 22, the signal on the output side may be mixed with an alternating current signal by the mixer 472b and is sent to the digital predistortion circuit 471 by, for example, switching.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first semiconductor layer formed over a substrate;
   a second semiconductor layer formed over the first semiconductor layer;
   an insulating film including a first insulating film formed over the second semiconductor layer, a second insulating film, and a third insulating film stacked sequentially over the first insulating film, and
   an electrode formed over the insulating film,
   wherein, in the first insulating film, a region containing halogen ions is formed under a region provided with the electrode, and
   the third insulating film contains a halogen; and
   the second insulating film is free from the halogen.

2. The semiconductor device according to claim 1, further comprising:
   a recess is formed in the third insulating film in the region, in which the electrode is provided, by removing part of the third insulating film.

3. The semiconductor device according to claim 1, wherein the halogen is chlorine or fluorine.

4. The semiconductor device according to claim 1, wherein the insulating film contains any one of an oxide, a nitride, and an oxynitride.

5. The semiconductor device according to claim 1, wherein, the insulating film contains at least one material of $Al_2O_3$, $SiO_2$, $HfO_2$, $Ta_2O_5$, $ZrO_2$, MgO, SiN, AlN, SiON, and AlON.

6. The semiconductor device according to claim 1, wherein the insulating film contains aluminum oxide.

7. The semiconductor device according to claim 1, wherein the electrode is a gate electrode, and
   a source electrode and a drain electrode are formed in contact with the second semiconductor layer.

8. The semiconductor device according to claim 1, wherein the first semiconductor layer is formed from a material containing GaN.

9. The semiconductor device according to claim 1, wherein the second semiconductor layer is formed from a material containing AlGaN.

10. The semiconductor device according to claim 1, wherein
    the semiconductor device is a HEMT.

11. A method for manufacturing a semiconductor device, the method comprising:
    forming a first semiconductor layer and a second semiconductor layer sequentially over a substrate;

forming a first insulating film over the second semiconductor layer;

implanting halogen ions into a predetermined region of the first insulating film by ion implantation of halogen ions or plasma irradiation of a halogen compound;

forming a second insulating film and a third insulating film sequentially over the first insulating film;

implanting halogen ions into the third insulating film by implantation of halogen ions or plasma irradiation of a halogen compound while keeping the second insulating film free from the halogen ions; and forming an electrode over the third insulating film above the predetermined region.

12. The method for manufacturing a semiconductor device, according to claim 11, wherein
the implanting halogen ions into a predetermined region of the first insulating film including
forming a resist pattern, which has an opening in a predetermined region, over the first insulating film and
performing implantation of halogen ions or plasma irradiation of a halogen compound into a surface provided with the resist pattern.

13. The method for manufacturing a semiconductor device, according to claim 11, further comprising:
forming a recess in the third insulating film in a region, in which the electrode is to be provided, by removing part of the third insulating film after the third insulating film is formed.

14. The method for manufacturing a semiconductor device, according to claim 11, wherein
the halogen is fluorine, and
the implanting halogen ions is performed by plasma irradiation using at least one gas of $CF_4$, $SF_6$, $SiF_4$, $NF_3$, and $F_2$.

15. The method for manufacturing a semiconductor device, according to claim 11, wherein
the halogen is chlorine, and
the implanting halogen ions is performed by plasma irradiation using at least one gas of $Cl_2$, $CCl_4$, $BCl_3$, and $SiCl_4$.

16. A method for manufacturing a semiconductor device, the method comprising:

forming a first semiconductor layer and a second semiconductor layer sequentially over a substrate;

forming a first insulating film over the second semiconductor layer;

implanting halogen ions into a predetermined region of the first insulating film by ion implantation of halogen ions or plasma irradiation of a halogen compound;

forming a second insulating film free from the halogen ions sequentially over the first insulating film;

forming a third insulating film containing a halogen over the second insulating film; and forming an electrode over the third insulating film above the predetermined region.

17. The method for manufacturing a semiconductor device, according to claim 16, wherein
the implanting halogen ions into the predetermined region of the first insulating film including
forming a resist pattern, which has an opening in a predetermined region, over the first insulating film and
performing ion implantation of halogen ions or plasma irradiation of a halogen compound into a surface provided with the resist pattern.

18. The method for manufacturing a semiconductor device, according to claim 16, further comprising:
forming a recess in the third insulating film in a region, in which the electrode is to be provided, by removing part of the third insulating film after the third insulating film is formed.

19. The method for manufacturing a semiconductor device, according to claim 16, wherein
the halogen is fluorine, and
the implanting halogen ions is performed by plasma irradiation using at least one gas of $CF_4$, $SF_6$, $SiF_4$, $NF_3$, and $F_2$.

20. The method for manufacturing a semiconductor device, according to claim 16, wherein
the halogen is chlorine, and
the implanting halogen ions is performed by plasma irradiation using at least one gas of $Cl_2$, $CCl_4$, $BCl_3$, and $SiCl_4$.

* * * * *